(12) United States Patent
Eisenhuth

(10) Patent No.: US 11,494,114 B1
(45) Date of Patent: Nov. 8, 2022

(54) READ THRESHOLD ADJUSTMENT TECHNIQUES FOR NON-BINARY MEMORY CELLS

(71) Applicant: Micron Technology, Inc., Boise, ID (US)

(72) Inventor: Robert B. Eisenhuth, Boulder, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/240,933

(22) Filed: Apr. 26, 2021

(51) Int. Cl.
*G06F 3/06* (2006.01)

(52) U.S. Cl.
CPC .......... *G06F 3/0655* (2013.01); *G06F 3/0619* (2013.01); *G06F 3/0679* (2013.01)

(58) Field of Classification Search
CPC ..... G06F 3/0655; G06F 3/0679; G06F 3/0619
See application file for complete search history.

(56) References Cited

U.S. PATENT DOCUMENTS

| | | | |
|---|---|---|---|
| 2015/0039842 A1* | 2/2015 | Fitzpatrick | G11C 16/349 711/154 |
| 2015/0085571 A1* | 3/2015 | Hu | G11C 11/5642 365/185.21 |
| 2020/0118620 A1* | 4/2020 | Bazarsky | G11C 29/42 |
| 2020/0393972 A1* | 12/2020 | Tomic | G06F 3/0619 |
| 2021/0191804 A1* | 6/2021 | Tao | G11C 16/3418 |

* cited by examiner

*Primary Examiner* — Mark A Giardino, Jr.
(74) *Attorney, Agent, or Firm* — Holland & Hart LLP

(57) ABSTRACT

Methods, systems, and devices for read threshold adjustment techniques for error recovery are described. A memory system may read a codeword from a memory array using one or more read thresholds. The memory system may increment one or more counters of the memory device based on reading the codeword. The one or more counters may indicate information related to how many bits of the codeword correspond to a particular logic value. The memory system may detect an error, such as an uncorrectable error, in the codeword based on reading the codeword. The memory system may adjust the one or more read thresholds based on the information indicated by the one or more counters and read the codeword using the adjusted read thresholds.

25 Claims, 11 Drawing Sheets

READ THRESHOLD ADJUSTMENT TECHNIQUES FOR NON-BINARY MEMORY CELLS

FIELD OF TECHNOLOGY

The following relates generally to one or more systems for memory and more specifically to read threshold adjustment techniques for non-binary memory cells.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
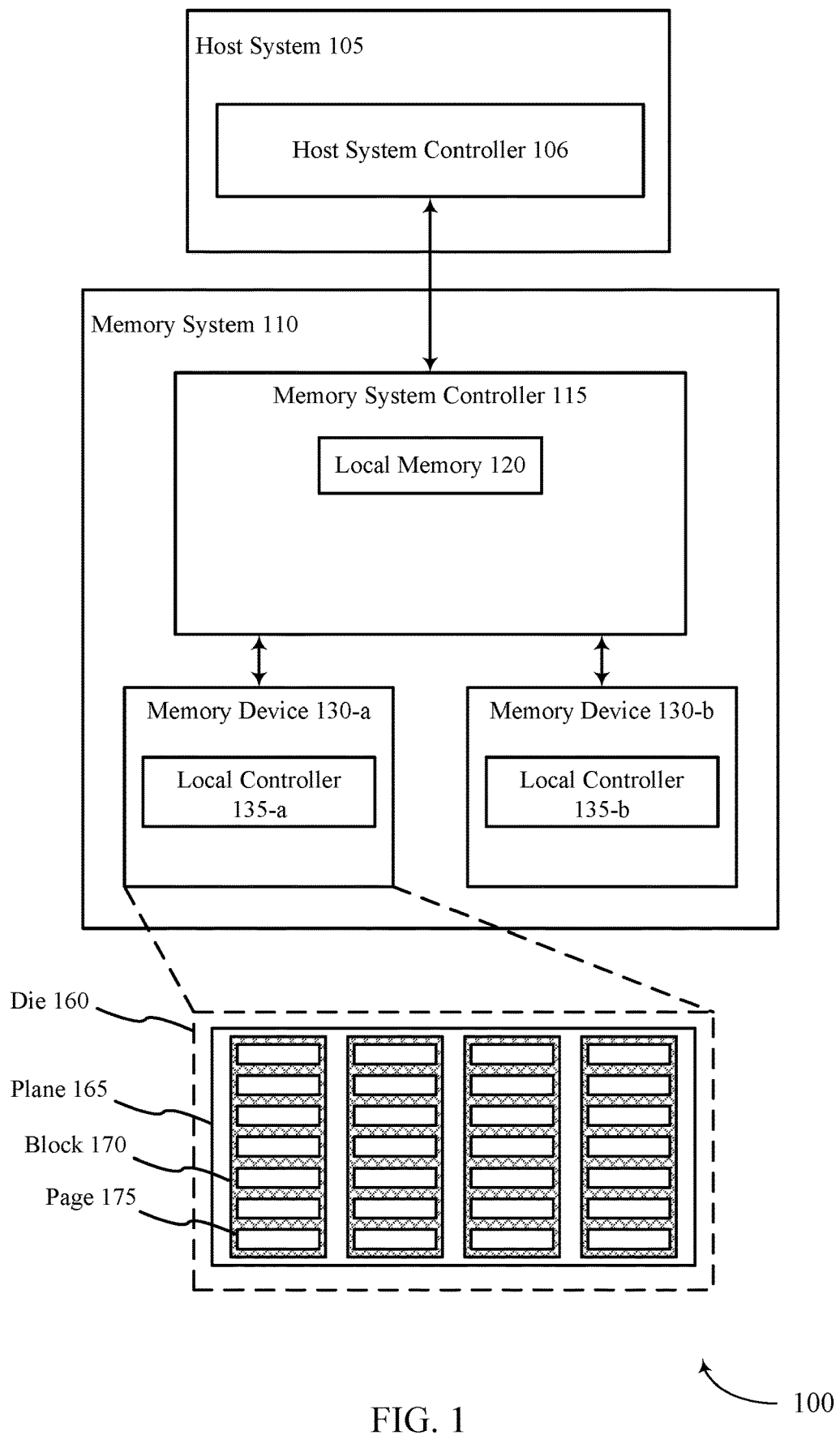
FIG. 1 illustrates an example of a system that supports read threshold adjustment techniques for non-binary memory cells in accordance with examples as disclosed herein.

A memory device may access a memory cell as part of a read operation. For example, the memory cell may output a signal to a sense component and the sense component may compare the signal to one or more read thresholds (e.g., reference voltages, reference currents, or any combination thereof). The memory device may determine a logic value of the memory cell (e.g., a stored logic value such as 0 or 1 for a binary memory cell configured to store one bit; 00, 01, 10, or 11 for a non-binary cell configured to store two bits; etc.) in response to comparing the signal to the one or more read thresholds. As an illustrative example, the memory device may determine that the memory cell is storing a first logic value (e.g., 0) if the signal is below a read threshold or that the memory cell is storing a second logic value (e.g., 1) if the signal is above the read threshold, although any quantity of thresholds and logic values may be used. In some examples the memory device may read a set of bits from a set of memory cells, where the set of bits may be referred to as a codeword. In some cases, the memory device may detect an uncorrectable error in response to reading one or more codewords from the memory cells. For example, the one or more read thresholds may have shifted over time due to program-erase (PE) cycles, read disturbances, cross-temperature effects, and the like. Such shifts may result in a quantity of errors that an error correction code (ECC) or other error correcting scheme of the memory device is unable to correct.

In accordance with the techniques described herein, the memory device may implement read threshold adjustment techniques for error recovery. Such techniques may enable the memory device to accurately shift one or more read thresholds after reading data in which a relatively high quantity of errors is detected (e.g., prior to reading the data again), which may correct at least a subset of errors (e.g., an uncorrectable error may be eliminated or become correctable due to the shifted read thresholds).

For example, a memory device may be configured to store data within a memory array as codewords that are balanced or at least nearly balanced, where a balanced codeword may include equal numbers of 1s and 0s. For example, a memory device may apply a scrambler (e.g., pseudo-random scrambler) before storing data and store the scrambled data as a codeword, where the codeword may be balanced or nearly balanced in response to the scrambler. In connection with reading data (e.g., codewords) from the memory array, the memory device may include one or more counters configured to track a quantity of logic values in the data.

In some examples, the memory cells may be examples of single level cells (SLCs) (e.g., the memory cells may each store a single logic value or bit such as a 0 or a 1). In such examples, the memory device may compare a signal from the memory cells to a read threshold to identify a logic value stored by a cell. The memory device may read a set of memory cells as part of reading a codeword. The memory device may increment a counter to track a quantity of a logic values in the codeword (e.g., the counter may be incremented if a 1 is read from a memory cell and thus may indicate a total quantity of 1s in the codeword). If the memory device detects that the codeword includes a relatively high quantity of errors (e.g., a quantity of errors that result in an uncorrectable quantity of errors), the device may be configured to select a direction or magnitude for shifting the one or more read thresholds using the one or more counters. By selecting the direction or magnitude for shifting the read thresholds using the counters, the memory device may reduce a quantity of attempts to read a codeword and reduce wear of the memory device (e.g., extend a life of the device due to predicting a correct direction to shift the read threshold relatively consistently), among other benefits.

In some examples, the memory device may shift the read threshold in accordance with the quantity of one or more logic values in the data. For example, the memory device may shift the read threshold in a first direction if the quantity of first logic values in the data (e.g., a quantity of 1s) is larger than a second quantity of second logic values in the data (e.g., a quantity of 0s). Alternatively, the memory device may shift the read threshold in a second direction if the quantity of the first logic values is smaller than the quantity of the second logic values. In some cases, the memory device may select a magnitude by which to shift the read threshold in response to the comparison (e.g., if the counter indicates a relatively high quantity, the memory device may shift the read threshold by a relatively large amount).

In some examples, the memory cells may be examples of non-binary memory cells as described herein, each of which may store at least two bits of information (e.g., 00, 01, 10, or 11 for memory cells each configured to store two bits, 000, 111, 011, etc. for memory cells each configure to store three bits, and so on). Stated alternatively, the memory cells may each include two or more levels for bit storage (e.g., a lower bit level may store a first bit which may be referred to as a lower bit, an upper bit level may store a second bit which may be referred to as an upper bit, an extra bit level may store a third bit which may be referred to as an extra bit, and so on for any quantity of levels). In some examples, a level may be referred to as a page (e.g., an upper level may be referred to as an upper page).

In some examples, the memory device may use a set of counters associated with the levels of the memory cells. In some cases, each level may be associated with a respective counter of the set of counters. For example, a first level (e.g., a lower level) may correspond to a first counter. The memory device increment the first counter to track a quantity of a logic values in data stored in the first level (e.g., the first counter may be incremented if a 1 is read from a lower level of the memory cell). The memory device may increment a second counter corresponding to a second level of the memory cells (e.g., an upper level) in response to reading data stored in the second level. For example, the second counter may indicate a quantity of memory cells whose stored logic values (e.g., the logic value of a lower bit and an upper bit) result in a logic gate output having a particular value (e.g., a XOR or XNOR logic gate may output a 1 or a 0 based on multiple bits stored by a given memory cell).

Such techniques may be used for any quantity of levels and counters. For example, if the memory cell stores three bits using a first, second, and third level respectively, the memory device may increment a third counter corresponding to the third level (e.g., a XOR or XNOR logic gate may output a 1 or a 0 based on a logic value of the lower bit, upper bit, and extra bit stored in a memory cell). Thus, a memory device may use a combination of the counters to evaluate multiple thresholds at once. For example, the memory device may use a linear combination of the counts of the set of counters to determine a direction, magnitude, or both for adjusting the multiple read thresholds.

Additionally or alternatively, the memory device may use a set of counters associated with a set of read thresholds, where each counter of the set of counters may correspond to a respective read threshold of the set of read thresholds. Each counter may track a quantity of logic values stored by the data for a respective read threshold (e.g., a lower page read threshold may correspond to a counter indicating a quantity of 1s or 0s read from the lower level of the memory cells, two upper bit read thresholds may correspond to two counters indicating a quantity of 1s or 0s read from the upper level of the memory cells, and so on). The memory device may implement logic to determine counts for each threshold. For example, the counter values for the upper bit read thresholds may fail to account for logic values being incorrectly read from another distribution as described herein. Thus, the memory device may adjust a first count by a second count (e.g., an edge or end threshold count may be subtracted from another threshold count to account for distributions improperly leaking across thresholds). The memory device may iteratively adjust counts in order to determine a count for each read threshold, and the memory device may adjust the read thresholds using the adjusted counts.

Features of the disclosure are initially described in the context of systems, devices, and circuits as described with reference to FIG. 1. Features of the disclosure are described in the context of read distributions and systems as described with reference to FIGS. 2-8. These and other features of the disclosure are further illustrated by and described with reference to an apparatus diagram and flowcharts that relate to read threshold adjustment techniques for error recovery as described with reference to FIGS. 9-12.

FIG. 1 is an example of a system 100 that supports read threshold adjustment techniques for non-binary memory cells in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a peripheral component interconnect express (PCIe) interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

Memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, where memory system 110 includes more than one memory device 130, different memory devices 130 within memory system 110 may include the same or different types of memory cells.

The memory system controller 115 may be coupled with and communicate with the host system 105 (e.g., via the physical host interface), and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130, and other such operations, which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. And in some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and may be available within the local memory 120 for subsequent retrieval for or manipulation (e.g., updating) by the host system 105 (e.g., with reduced latency relative to a memory device 130) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM). Additionally or alternatively, a memory device 130 may include one or more arrays of volatile memory cells. For example, a memory device 130 may include random access memory (RAM) memory cells, such as dynamic RAM (DRAM) memory cells, synchronous DRAM (SDRAM) memory cells, or SRAM memory cells.

In some examples, a memory device 130 may include (e.g., on a same die or within a same package) a local controller 135, respectively, which may execute operations on one or more memory cells of the memory device 130. A local controller 135 may operate in conjunction with a memory system controller 115 or may perform one or more functions ascribed herein to the memory system controller 115.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as SLCs. Additionally or alternatively, a NAND memory device 130 may include memory cells configured to each store multiple bits of information, which may be referred to as MLCs if configured to each store two bits of information, as tri-level cells (TLCs) if configured to each store three bits of information, as quad-level cells (QLCs) if configured to each store four bits of information, or more generically as multiple-level or multi-bit memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support read threshold adjustment techniques for non-binary memory cells. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

The system 100 may implement read threshold adjustment techniques as described herein. For example, the memory system 110 (or the host system 105) may adjust one or more read thresholds using one or more counters as described herein, which may enable the memory system 110 to correct one or more errors (e.g., otherwise uncorrectable errors), reduce a quantity of reading operations for a codeword, extend a life of the memory system 110, or any combination thereof, among other benefits. For example, the memory system 110 may include one or more counters configured to track a quantity of logic values in data. The memory system 110 may be configured to select a direction or magnitude for shifting the one or more read thresholds using the one or more counters. In some examples, the memory devices 130 may include SLCs or multiple-bit cells (e.g., MLCs, TLCs, QLCs, and so on). Though certain examples may be described herein in the context of NAND memory cells, it is to be understood that the techniques described herein may be applied in the context of any type of memory cells.

Figure 2:
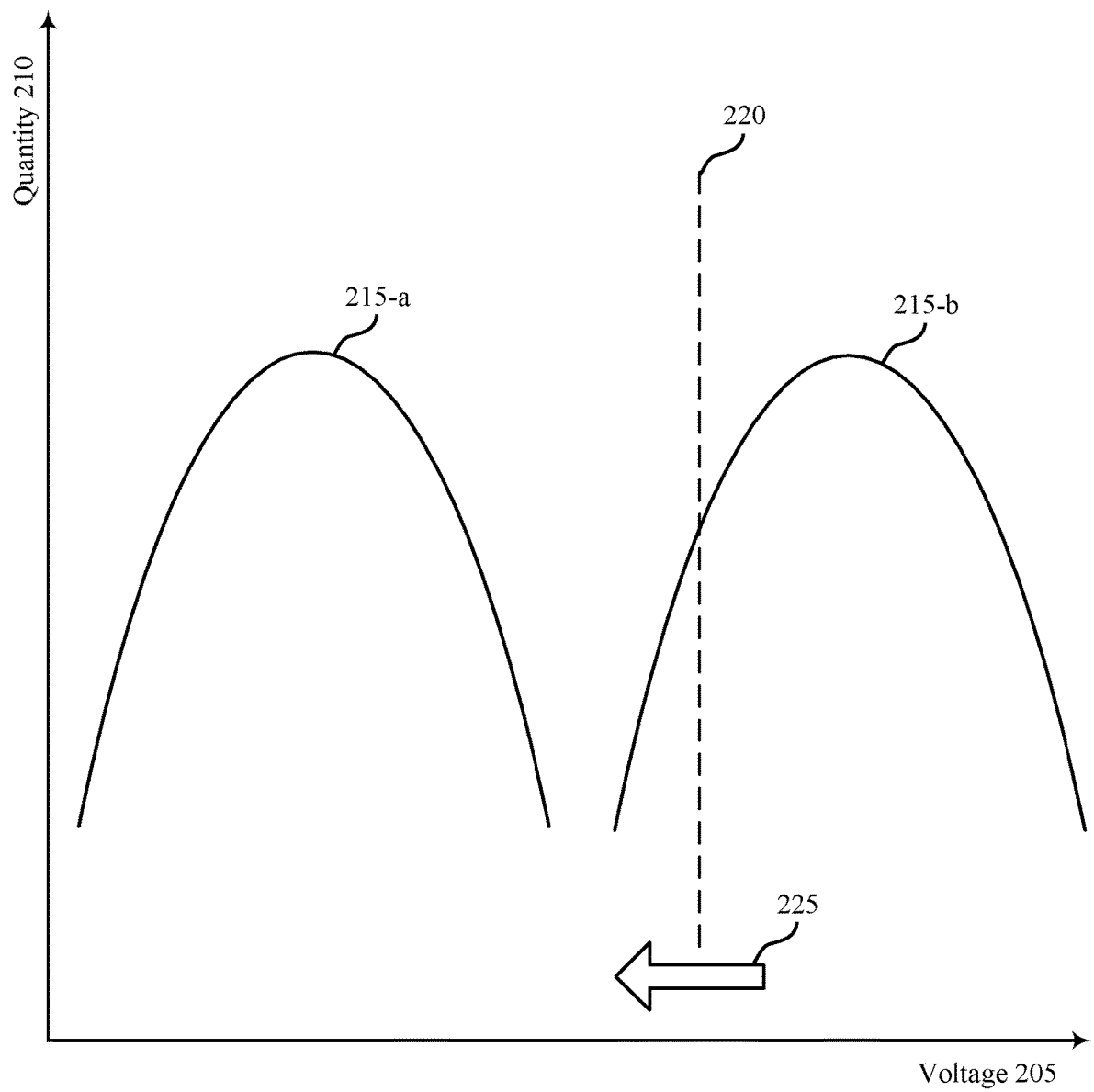
FIG. 2 illustrates a plot of example read distributions that support read threshold adjustment techniques for non-binary memory cells in accordance with examples as disclosed herein.

FIG. 2 illustrates a plot 200 of example read distributions that support read threshold adjustment techniques for non-binary memory cells in accordance with examples as disclosed herein. The plot 200 may illustrate examples of operations implemented by a system 100 as described with reference to FIG. 1 or another system as described herein. The plot 200 may include a voltage axis 205 and a quantity axis 210 for illustrative clarity, although other metrics may be used (e.g., a current axis or a charge axis rather than a voltage axis). Generally, the plot 200 may illustrate example distributions 215 for the voltages of signals read from (e.g., in response to reading) memory cells in a memory array and an example adjustment 225 of a threshold 220 using one or more counters.

The plot 200 may include a read threshold 220, which may be an example of a voltage threshold, though a current threshold or charge threshold may additionally or alternative be used. The read threshold 220 may be used as part of one or more access operations (e.g., read operations). For example, a memory device may receive a command to read data from an address of a memory array. The data may be a codeword indicated by an address in the command. The memory device may access memory cells associated with the codeword (e.g., each memory cell included in the address) and compare an output of a memory cell to the read threshold 220. For example, if a sense component of the memory device detects a voltage lower than the read threshold 220, the memory device may read the corresponding memory cell as storing a first logic value (e.g., a 0 or a 1). Alternatively, if the sense component detects a voltage higher than the read threshold 220, the memory device may read the corresponding memory cell as storing a second logic value (e.g., a 1 or a 0).

The plot 200 may include distribution 215-a and distribution 215-b. The distributions 215 may illustrate the voltages of signals sensed for a quantity of memory cells from which a codeword is read that are storing a respective logic value. For example, a point on the distribution 215-a may represent a quantity of memory cells storing a respective voltage value. The memory cells with voltages on the distribution 215-a may be examples of memory cells previously written with a first logic value (e.g., 1) and the distribution 215-b may be examples of memory cells previously written with a second logic value (e.g., 0). Although shown as parabolic curves for illustrative clarity, it is to be understood that the distributions 215 may be any shape or associated with any logic value.

The memory device may implement one or more ECC schemes to detect or correct errors in the data. For example, the memory device may use error-correcting cyclic codes such as Bose, Chaudhuri, and Hocquenghen (BCH) codes. Additionally or alternatively, the memory device may use linear error-correcting codes, such as low-density parity-check (LDPC) codes. It is to be understood that any type of code-based technique or other technique for error correction or detection may be implemented by the memory device. User data may be stored in the memory array as one or more codewords. For example, ECC bits may be generated using the ECC scheme and the codeword may include the user data bits and ECC bits (e.g., parity bits).

In some examples, the memory system may implement one or more encoders (e.g., as part of one or more memory devices 130 or a memory system controller 115), which in some cases may be referred to as scramblers, to generate balanced codewords in response to user data to be written to the memory array, such that the memory array may store balanced or nearly balanced codewords representative of the user data. As an illustrative example, the memory system may use a scrambler or other encoder to generate a sequence of bits from user data where each bit has an equal probability of being a 1 or a 0. Thus, a memory device may store user data (e.g., regardless of the original user data sequence of bits) in the form of codewords in which bits having a relatively similar probability of being a 0 or a 1, which may improve a reliability and lifespan of the memory device and reduce read disturbance.

In some examples, the read threshold 220 may deviate from a desired value, which may result in one or more errors in the data. Viewed alternatively, the distributions 215 may shift over time such that an ideal location of the read threshold 220 at some later time may be different from an ideal location of the read threshold 220 at some prior time. For example, the ideal location of read threshold 220 may be shifted over time due to PE cycles, read disturbances, cross temperature effects, or a combination thereof (e.g., the distributions 215 may shift over time due to PE cycles, read disturbances, cross temperature effects, or a combination thereof). Such shifts may result in a portion of the memory cells being read as incorrect values. For example, memory cells of the distribution 215-b (e.g., written to a second logic value such as a 1 or a 0) that are located to the left of the read threshold 220 may be incorrectly read as memory cells of the distribution 215-a. As an illustrative example, memory cells written as a second logic value (e.g., 0) may be read as the first logic value (e.g., 1) due to the voltage of those memory cells being less than the read threshold 220. In some examples, such a shift in the read threshold 220 may introduce a relatively large quantity of errors in a codeword, which may result in an detectable but uncorrectable error (e.g., more erroneous bits than an ECC scheme of the memory device may correct, but not so many erroneous bits that the ECC scheme of the memory device fails to detect the error, such as a two-bit error if the ECC scheme is a single-error-correcting double-error-detecting (SECDED) scheme, for example).

Accordingly, the memory system may adjust the read threshold 220 using one or more counters. For example, the memory system may use a pseudo-random or random scrambler to encode user data to a codeword (e.g., the memory system may include the scrambler, for example, in a controller of the memory system or elsewhere in the memory system). In such an example, the probability that a bit of the codeword is a first logic value may be 0.5, although any probabilities or scramblers may be used. The decoder of the memory system may include a counter configured to count the quantity of bits having a particular logic value within a codeword read from the memory. For example, a counter may increment each time a 1 is read as part of the codeword, and the counter value may indicate the quantity of 1s in the codeword. Alternatively, the counter may track the quantity of bits that are of a second logic value (e.g., a quantity of 0s in the codeword).

For a given codeword, the memory system may compare the quantity (e.g., count) of bits having a first logic value indicated by the counter to a threshold or a quantity of bits having a second logic value. For example, the memory system may compare the quantity to a difference between the total quantity of bits in the codeword and the quantity (e.g., if a codeword has 9312 bits, the memory system may compare the quantity to 9312 minus the quantity, as one example). It is to be understood that these and any other specific numbers provided herein are examples provided solely for the sake of illustrative clarity and are not limiting of the claims. Additionally or alternatively, the memory system may compare the quantity to one or more threshold quantities (e.g., the memory system may determine whether the quantity of bits having a first logic value is greater than or less than half the bits in the codeword, or greater than or less than half the bits in the codeword by at least some amount).

The memory system may perform an adjustment 225 in response to the comparison. For example, the memory system may select a direction, a magnitude, or both to adjust (e.g., shift) the read threshold 220 in response to the quantity indicated by the counter. As an illustrative example, the memory system may determine that the quantity of 1s in the codeword is greater than the quantity of 0s or satisfies a threshold quantity of 1s. The memory system may shift the read threshold 220 in a direction associated with the determination. For instance, the memory system may shift the read threshold 220 to the left (e.g., adjust a reference voltage for read operations to be relatively smaller) such that the read threshold 220 is located relatively closer to the distribution 215-a. Additionally or alternatively, the memory system may determine a magnitude of the adjustment 225 in response to the counter (e.g., a table may indicate the magnitude, the magnitude may scale with the quantity such that a relatively large quantity of 1s in the codeword corresponds to a relatively large adjustment 225, etc.). Although described as adjusting to the left (e.g., towards distribution 215-a) and tracking the quantity of the first logic value in the codeword for illustrative clarity, any additional or alternative variations may be implemented by the memory system (e.g., the memory system may adjust to the right in response to a counter, the memory system may track the quantity of second logic values, and the like). In some examples, the memory system may perform the techniques described herein regardless of whether an error is uncorrectable or not (e.g., a relatively high quantity of errors may satisfy a threshold and the memory system may proactively shift the thresholds using the techniques described herein to reduce the quantity of errors).

The memory system may perform another read operation after adjusting the read threshold 220. For example, the memory system may read the codeword from the memory cells using the adjusted read threshold 220. By adjusting the read threshold 220 in the selected direction or magnitude, the second read operation may result in a relatively higher or lower quantity of the first logic value. For example, a lower quantity of 1s may be read due to the read threshold being shifted such that memory cells of the distribution 215-b that were incorrectly read as is in the first read operation due to the initial location of the read threshold 220 now being correctly read as 0s due to the shifted location of the read threshold 220. Accordingly, a quantity of errors may be reduced such that errors may be eliminated or an ECC code may correct any remaining errors. In some examples, the memory system may perform additional or alternative adjustments 225. For example, if the second read operation results in another uncorrectable error, the memory system may repeat the comparison and adjustment process until a successful read occurs. Alternatively, the memory system may perform an adjustment in an opposite direction in response to the second uncorrectable error (e.g., the memory system may shift the threshold to the left for a second operation and shift the threshold to the right of the initial read threshold 220 for a third operation in response to the second operation including an uncorrectable error).

As one illustrative example, the memory system may detect an error using BCH code (e.g., an ECC decoder may be an example of a BCH decoder). The user data size may be 1 Kilobyte (KB) (e.g., 8000 bits) and a size of the codeword may be 9312 bits, which may support correction of up to 80 errors in the data. In other words, for an uncorrectable error to occur, 81 or more bits of the data may be flipped to an incorrect value. The memory system may determine that a first quantity of the bits corresponding to a first logic value is greater than a second quantity of the bits corresponding to a second logic value (e.g., the codeword was read with more 1s than 0s or more 0s than 1s). In such cases, there may be a relatively high probability that the correct direction to adjust the read threshold 220 is the direction that results in a relatively higher quantity of bits corresponding to the second logic value (e.g., shifting the threshold left to result in more 0s from the distribution 215-b). In other words, the memory system may shift the threshold in a direction that results in a high quantity of bits corresponding to the second logic value due to determining that the first quantity of bits if higher than the second quantity of bits. For example, in order for the codeword to be uncorrectable and the direction indicated by the counter to be incorrect, there may be at least $$T + 2 + \left(\frac{9312}{2}\right)$$

bits that correspond to the first logic value in the data (e.g., in a codeword), where T represents the quantity of bits the ECC code can correct. The probability that the original scrambled codeword included such a quantity of bits having the first logic value may be relatively low, and the probability that the threshold 220 shifting to reduce the quantity of 1s (e.g., to the left) is the correct direction may accordingly be relatively high.

As another illustrative example, the memory system may detect an error using LDPC code (e.g., an ECC decoder may be an example of a LDPC decoder). In such examples, the code may correspond to a set quantity of errors that render codeword uncorrectable. In such examples, the probability that a direction is a correct direction may be calculated as a product of the probability that the original scrambled codeword includes the indicated quantity of bits with a first logic value and the probability that the quantity of bits may result in an uncorrectable error.

In some examples, the memory system may calculate such probabilities described herein and shift the threshold 220 in response to the calculation. For example, the memory system may use a binomial formula or other calculation techniques to determine a probability that a direction is correct, and select the direction in response to the probability. Additionally or alternatively, the memory system may be pre-configured with thresholds and may adjust the threshold 220 in response to the pre-configured thresholds. For example, the memory system may be configured to shift a direction to reduce the greater quantity of bits (e.g., if quantity of 1s are greater than quantity of 0s in the codeword, shift to a lower voltage threshold 220 such that the quantity of 1s are reduced). Additionally or alternatively, the memory system may be configured to store and consult a look-up table and may adjust the threshold 220 in a direction, magnitude, or both indicated in the table by a field corresponding to a respective counter value or range of counter values. The different counter values associated with the different entries of the look-up table may be in response to such probabilities as determined prior to configuration of the memory system or in response to experimental techniques, for example.

Figure 3:
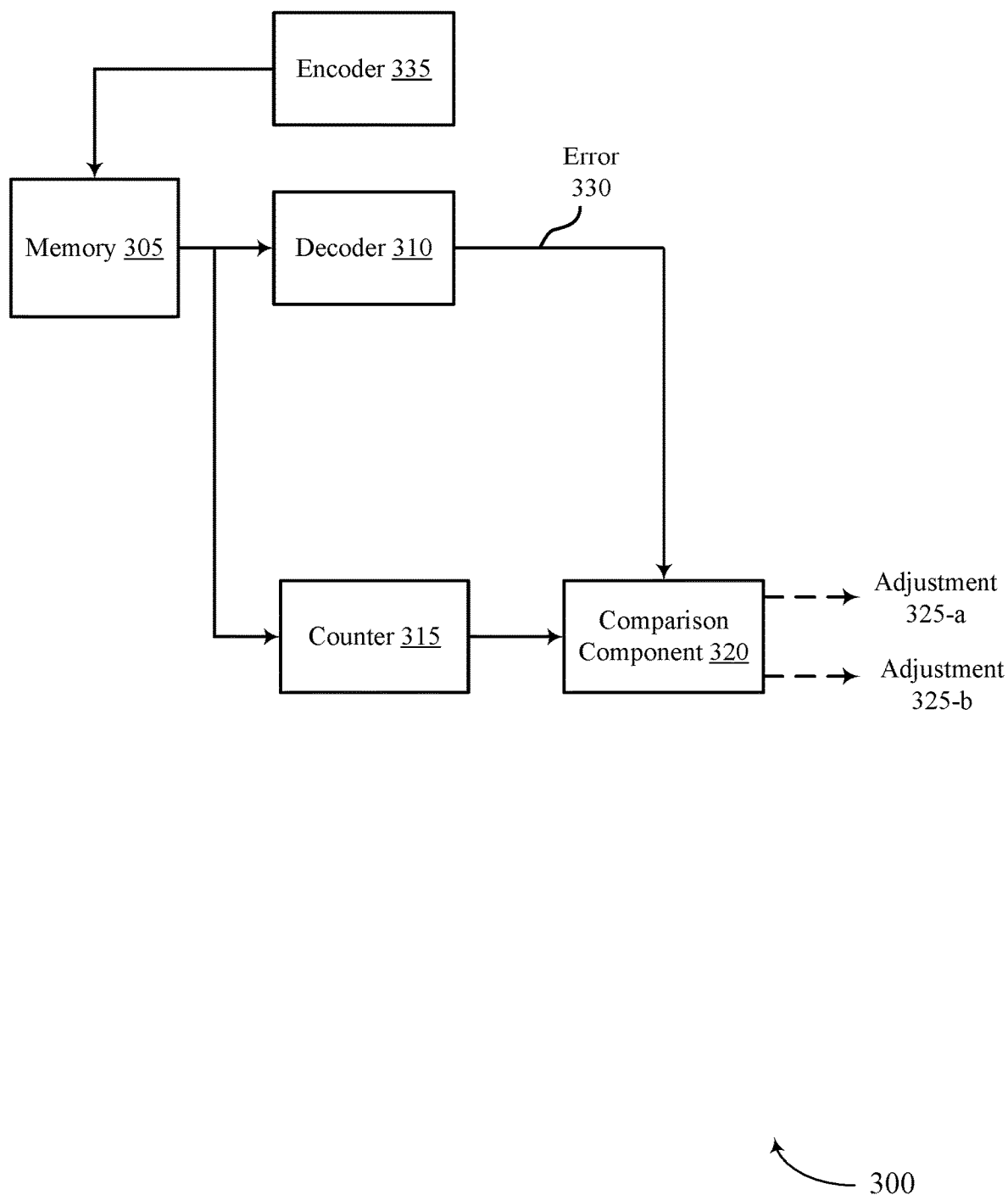
FIG. 3 illustrates an example of a system that supports read threshold adjustment techniques for non-binary memory cells in accordance with examples as disclosed herein.

FIG. 3 illustrates an example of a system 300 that supports read threshold adjustment techniques for non-binary memory cells in accordance with examples as disclosed herein. In some examples, the system 300 may be an example of or include aspects of the system 100 and/or the plot 200 as described with reference to FIGS. 1 and 2. For example, the system 300 may include memory 305, which may be example of a memory array as described herein (e.g., NAND SLC memory cells). The system 300 may illustrate an example implementation of adjusting a read threshold using a decoder 310, a counter 315, and a comparison component 320. Although shown as separate for illustrative clarity, the various components of the system 300 may be combined or located different than shown (e.g., the decoder 310 may include the counter 315 and the comparison component 320 in logic).

In some examples, the system 300 may include an encoder 335. The encoder 335 may be configured to scramble user data into a codeword as described herein with reference to FIG. 2. For example, the encoder 335 may receive user data and generate a balanced sequence of 0's and 1's using a scrambler as described herein. The encoder 335 may additionally or alternatively be configured to encode the codeword using an ECC code, to support an error detection or correction procedure if later reading the codeword from the memory 305.

The system 300 may show a data path for performing an adjustment 325 of a read threshold using the techniques described herein with reference to FIG. 2. For example, data (e.g., a codeword) may be read from the memory 305. The data may be input to the decoder 310 and the counter 315. The decoder 310 may detect an uncorrectable error 330 in response to decoding the data. In some examples, the decoder 310 may include a descrambler in addition or in the alternative to the ECC decoder. For example, the decoder 310 may be configured to descramble the codeword to the original user data as part of the read operation. Additionally or alternatively, the counter 315 may track a quantity of bits in the data that correspond to a first logic value (e.g., the counter may increment each time a 1 or a 0 is read from a memory cell) as described with reference to FIG. 2.

The comparison component 320 may receive a quantity of bits corresponding to the first logic value from the counter 315, an indication that the data includes an uncorrectable error from the decoder 310, or both. For example, if the decoder 310 detects that the errors 330 in the data are uncorrectable (e.g., the data includes an uncorrectable quantity of errors for an ECC scheme), the decoder 310 may indicate the error 330 to the comparison component 320. The comparison component 320 may compare the quantity of bits to a second quantity of bits (e.g., a quantity of 0s to a quantity of 1s). In some examples, the comparison component 320 may compare the quantity of bits indicated by the counter 315 to one or more thresholds (e.g., determine whether the quantity of bits satisfies, exceeds, or falls below a threshold such as half the bits of the codeword, or some number of other thresholds in order to identify an extent to which the codeword is unbalanced as read).

The memory system may perform an adjustment 325 using a result from the comparison component 320. For example, if the comparison component 320 indicates that the quantity of bits with the first logic value is greater than the quantity of bits with the second logic value or satisfies a threshold, the memory system may select a direction to reduce the quantity of bits with the first logic value for a subsequent read operation. As an illustrative example, the memory system may determine that the quantity of 1s is greater than the quantity of 0s in a codeword or satisfies a threshold quantity. The memory system may also determine that the error 330 is uncorrectable. For example, a logic gate may receive the indication that the error 330 is uncorrectable and an indication of whether the quantity of bits with a first logic value is greater or less than the quantity of bits with a second logic value. The logic gate may output a signal indicating that the error 330 is uncorrectable and a first result of the comparison component 320 (e.g., more is than 0s). In such examples, the memory system may perform adjustment 325-a (e.g., the memory system may shift the threshold to obtain a relatively higher quantity of 0s). The direction of the shift, the magnitude of the shift, or both may be in response to the outputs of the counter 315 and the comparison component 320. Alternatively, the logic gate may output a signal indicating that the error 330 is uncorrectable and a second result of the comparison component 320 (e.g., more 0s than 1s). In such examples, the memory system may perform adjustment 325-b (e.g., the memory system may shift the threshold to obtain a relatively higher quantity of 1s). Accordingly, the memory system may adjust the read threshold from a first value to a second value, where the direction of the adjustment, the magnitude of the adjustment, or both may be in response to the outputs of the counter 315 and the comparison component 320. After adjusting the read threshold, the memory system may read the codeword using the read threshold having the second value. Such process may repeat as needed until a codeword is read that is error-free or correctable by the decoder 310, or until a threshold number of attempts (codeword reads) are performed.

Figure 4:
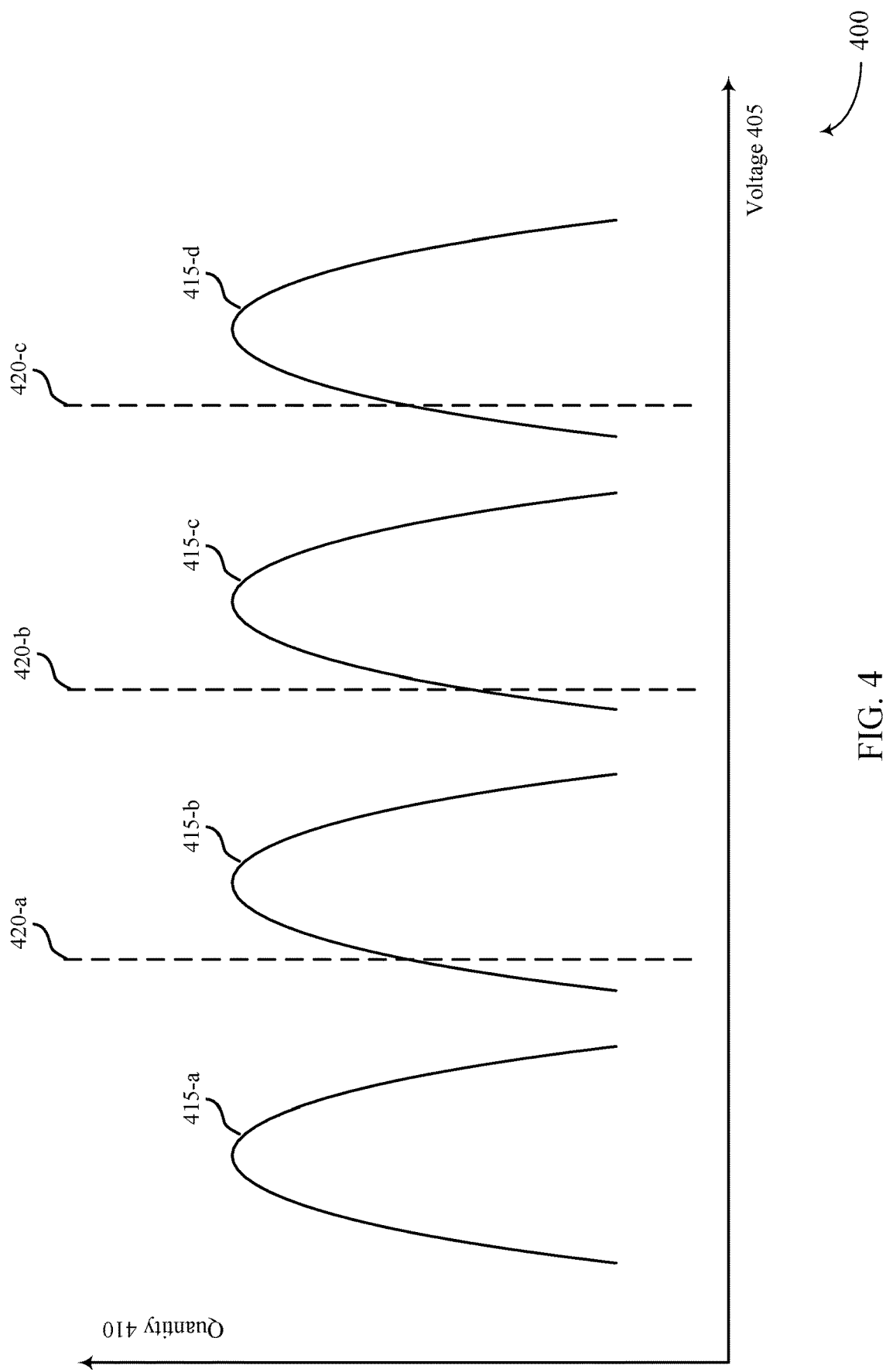
FIG. 4 illustrates a plot of example read distributions that support read threshold adjustment techniques for non-binary memory cells in accordance with examples as disclosed herein.

FIG. 4 illustrates a plot 400 of example read distributions that support read threshold adjustment techniques for non-binary memory cells in accordance with examples as disclosed herein. The plot 400 may be an example of operations implemented by a system 100 as described with reference to FIG. 1. The plot 400 may implement aspects of the plot 200 or the system 300 as described with reference to FIGS. 2 and 3, respectively. Generally, the plot 400 may illustrate example distributions 415 for MLC data in a memory array. As an illustrative example, the plot 400 shows thresholds 420 and distributions 415 for memory cells storing two bits, although aspects of the teachings herein may be extended to memory cells each storing any quantity of bits.

The plot 400 may include a read threshold 420-a, a read threshold 420-b, and a read threshold 420-c, which may be examples of voltage thresholds, though current thresholds or charge thresholds may additional or alternatively be used. A memory system may read memory cells using the read thresholds 420. For example, the memory system may compare a voltage of a signal generated in response to reading a memory cell to the read thresholds 420 and identify a logic value in response to comparing the voltage.

In some examples, the different thresholds 420 may be associated with respective bits stored in the memory cell. As an example of a MLC memory cell storing two bits, the threshold 420-b may be associated with a respective first bit of the memory cell, which may be referred to as a "lower bit" or a "lower page bit" of the memory cell. In some cases, the threshold 420-b may be referred to as a "lower page threshold." The threshold 420-a and the threshold 420-c may be associated with a respective second bit of the memory cell, which may be referred to as an "upper bit" or an "upper page bit" of the memory cell. In some cases, the thresholds 420-*a* and 420-*c* may be referred to as "upper page thresholds." As an illustrative example, if a voltage signal of a memory cell is less than the threshold 420-*b* the memory cell may read the respective first bit (e.g., lower page bit) as a 1. The memory system may read the respective second bit (e.g., upper page bit) using the read threshold 420-*a* if the respective first bit is 1. For example, the memory system may read the second bit as a 1 if the voltage signal is less than the threshold 420-*a* and a 0 if the voltage signal is greater than the threshold 420-*a*. As another illustrative example, the memory system may read the respective first bit as a 0 if the voltage signal is greater than the read threshold 420-*b*. The memory system may read the respective second bit as a 0 if the voltage signal is less than the read threshold 420-*c* and a 1 if the voltage signal is greater than the read threshold 420-*c*.

In such examples, the distribution 415-*a* may correspond to memory cells written with a logic value of 11 (e.g., a lower page bit of 1 and an upper page bit of 1), the distribution 415-*b* may correspond to memory cells written with a logic value of 01 (e.g., a lower page bit of 1 and an upper page bit of 0), the distribution 415-*c* may correspond to memory cells written with a logic value of 00 (e.g., a lower page bit of 0 and an upper page bit of 0), and the distribution 415-*c* may correspond to memory cells written with a logic value of 10 (e.g., a lower page bit of 0 and an upper page bit of 1). In some examples, the logic values, distributions 415, and read thresholds 420 may be different than described (e.g., distributions 415 and read thresholds 420 may be associated with different logic values, lower page bits, or upper page bits). Although shown as parabolic curves for illustrative clarity, it is to be understood that the distributions 415 may be any shape or associated with any logic value.

In some examples, one or more of the distributions 415 may become shifted over time such that the one or more read thresholds 420 deviate from an ideal read threshold, which may result in one or more errors in the data. For example, the distributions 415 may become shifted over time due to PE cycles, read disturbances, cross temperature effects, or a combination thereof. The shift may result in a portion of the memory cells being read as storing incorrect values. For example, memory cells of the distribution 215-*b* (e.g., written to a second logic value such as a 01) that are located to the left of the read threshold 420-*a* may be incorrectly read as memory cells of the distribution 215-*a*, memory cells of the distribution 215-*c* (e.g., written to a third logic value such as 00) that are located to the left of the read threshold 420-*b* may be incorrectly read (e.g., read as 01), and the like. As an illustrative example, memory cells written with a second logic value (e.g., 01) may be read as storing the first logic value (e.g., 11) due to the voltage of those memory cells being less than the read threshold 420-*a*. In some examples, such a shift in the read thresholds 420 may introduce a relatively large quantity of errors in a codeword, which may result in an error that is detectable but uncorrectable by an ECC scheme of the memory system.

Accordingly, the memory system may adjust one or more read thresholds 420 using one or more counters. For example, the memory system may use a pseudo-random or random scrambler to encode user data to generate data, which may be stored in a memory array as a representation of the user data. In such an example, the probability that a bit of the data may correspond to one of four logic values may be 0.25, although any quantity of bits, logic values, probabilities, or scramblers may be used. The decoder of the memory system may include one or more counters configured to increment as the memory system reads the data from the memory.

In some examples, such as for multi-bit cells (e.g., MLC, TLC, QLC, etc.) configured to store two or more bits of information, the memory system may implement multiple counters. For example, a memory cell of the set of memory cells may include two or more levels for bit storage. In the example of a MLC cell shown in FIG. 4, a lower bit may be stored on a lower page (e.g., a lower level) of the memory cell and an upper bit may be stored in an upper page (e.g., an upper level) of the memory cell, as described above. As an illustrative example, if the lower bit has a logic value of 1, the voltage of the memory cell may be written to the left of the lower page read threshold 420-*b*. In such an example, the upper bit may be a logic value of 1 if written to the left of the upper page read threshold 420-*a* or 0 if written to the right. As another example, the lower bit may have a logic value of 0 and written to the right of the lower page read threshold 420-*b* and an upper bit value of 0 may be written to the left of the upper page read threshold 420-*c*. In some examples, data may be stored in the memory cells such that a codeword is written and read on a respective level (e.g., each bit of a codeword may be stored on a lower level of the memory cells and each bit of a second codeword may be stored on an upper level of the memory cells).

In some examples, the memory system may use a set of counters associated with the levels of the memory cells. For example, each level (e.g., page) may be associated with a respective counter. In the example of FIG. 4 with an upper level and a lower level, the memory system may include a first counter associated with the read threshold 420-*b* and a second counter associated with the read thresholds 420-*a* and 420-*c*. In such examples, the memory system may increment the first counter in a SLC manner. For example, the first counter may be incremented to track a quantity of memory cells storing a lower page bit logic value of 0 or 1.

The memory system may increment the second counter using one or more logic gates. For example, the memory system may include logic circuitry (e.g., one or more Boolean or other logic gates) and may increment a counter in response to an output of the logic circuitry. The memory system may adjust the thresholds 420 using the counter indicating a quantity of memory cells having a first result of the logic gate (e.g., the memory system may compare the quantity to a threshold or a second quantity of memory cells having a second result and adjust the thresholds 420 associated with the counter using the comparison). In some cases, the logic circuitry may include an XNOR logic gate. For example, the upper page bit and the lower page bit of a same memory cell may be input to the XNOR logic gate. The XNOR logic gate may be configured to output a first logic value (e.g., 1) if two inputs are the same and output a second logic value (e.g., 0) if the two inputs are different, the two inputs including the respective first bit of a memory cell (e.g., the lower page bit) and the respective second bit of the memory cell (e.g., the upper page bit). Additionally or alternatively, other logic gates may be used for one or more counters (e.g., XOR logic gates). For example, the XOR logic gate may be configured to output a first logic value (e.g., 1) if the two inputs (e.g., the lower page bit and the upper page bit) are different.

Accordingly, the memory system may implement an algorithm to determine a direction or magnitude of adjustment of the read thresholds 420 for any quantity of levels (e.g., bits stored by a memory cell) using the values indicated by the counters. The algorithm may include determining excess logic values (e.g., excess 1s) stored across each level and shifting the read thresholds 420 in a magnitude or direction in response to the total number of excess 1s or 0s. For example, the memory system may increment the first counter in the SLC manner as described above (e.g., the memory system may count the quantity of 1s which may be used to determine excess 1s in the lower bit level of the data). The memory system may increment the second counter using a logic operation (e.g., XNOR) of the lower bit and the upper bit. Thus, the memory system can determine excess bits stored to the right of the read thresholds 420-*a* and 420-*c*. The memory system may perform such operations for further counters if more than two bits are stored in the cell (e.g., for TLC, the memory system may XOR all three bits as inputs, track the quantity of 1s, and subtract half the memory cells in the data or codeword to calculate the number of bits to the left of the 4 extra bit level thresholds). Thus, the memory system may obtain a first count associated with the first counter indicating excess 1s of the lower level, a second count associated with a second counter indicating excess 1s in the upper level, and so on. For example, the memory system may perform a linear combination of the values indicated by the counters which will indicate the total number of excess 1s across each bit level. For example, the first count may be the value of the counter, the second count may be the value of the second counter multiplied by two, a third count may be the value of a third counter multiplied by four, and so on. The resulting value (e.g., the linear combination) may be used to determine which direction or magnitude to shift all of the thresholds 420. Although described as using a linear combination for a total count, it is to be understood any technique may be used to evaluate the values indicated by the counters associated with each level of the memory cells.

Additionally or alternatively, the memory system may use a set of counters respectively associated with a set of read thresholds 420. In other words, each counter of the set of counters may correspond to a respective read threshold 420 of the set of read thresholds 420. Each counter may track a quantity of logic values stored by the data for a respective read threshold 420. As an example, a lower page read threshold 420-*b* may correspond to a first counter indicating a quantity of 1s read from the lower level of the memory cells, a second counter may correspond to the upper page read threshold 420-*a* indicating a quantity of 1s read from a the distribution 415-*b*, a third counter may correspond to the upper page read threshold 420-*c* indicating a quantity of 1s read from the upper level of the memory cells, and so on for memory cells with more than four read thresholds 420-*c*. The memory system may implement adjustment operations to determine counts for each threshold. For example, the memory system may iteratively adjust the counts for each counter associated with each respective read thresholds 420 to determine an accurate count for each read threshold 420. In other words, such adjustment operations may account for the counts of other counters, which may improve an accuracy of the counts. As an illustrative example, the memory system may read an even quantity of 0s and 1s across the read thresholds 420-*b* due to an amount of 1s incorrectly coming from the distribution 415-*d* and an equal amount of 0s incorrectly coming from the distribution 415-*c*. Accordingly, the memory system may use the edge read thresholds 420-*a* and 420-*c* to first determine a quantity of excess logic values (e.g., bits may only be incorrectly read from one direction, so the excess count is accurate for read thresholds 420 on an edge of the plot 400). The memory system can then adjust the count of the counter for the read threshold 420-*b* by subtracting any excess logic values from the edge thresholds 420, which results in an accurate quantity of excess logic values for the read threshold 420-*b*. Such techniques may be extended to more read thresholds 420 for more bits stored per logic cell.

The memory system may perform an adjustment of one or more read thresholds 420 using the set of counters. For example, the memory system may select a direction, a magnitude, or both to adjust (e.g., shift) the read threshold 220 in response to the quantity indicated by the one or more counters (e.g., the linear combination of the counters to shift the thresholds together, or the memory system may treat each read threshold 420 separately and shift in the direction that offsets the quantity of excess logic values). As one illustrative example, the linear combination may indicate that the read thresholds 420 are relatively too far right and the memory system may adjust the read thresholds 420 to the left by a magnitude scaled by the quantity of excess logic values (e.g., excess 1s).

The memory system may perform another read operation after adjusting the read thresholds 420. For example, the memory system may read the data using the adjusted read thresholds 420. By adjusting the read thresholds 420 in the selected direction or magnitude in response to the counters, errors in the data may be eliminated or reduced such that an ECC code may be used to correct any remaining errors or the memory system may proactively adjust the thresholds to reduce the effects of read disturbances and the like. In some examples, the memory system may perform additional or alternative adjustments 225. For example, if the second read operation results in another uncorrectable error or a relatively high quantity of errors, the memory system may repeat the comparison and adjustment process until a successful read occurs. Alternatively, the memory system may perform an adjustment in an opposite direction in response to the second uncorrectable error (e.g., the memory system may shift the thresholds a first direction for a second operation and shift the thresholds to an opposite direction from an initial location for a third operation in response to the second operation including an uncorrectable error) or if the quantity of errors increases after the adjustment.

While shown as two bits per cell for illustrative clarity, it is to be understood that the concepts described with reference to FIG. 4 may be implemented for other cell types storing any quantity of bits (e.g., other multi-bit cells such as TLC or QLC). For example, a TLC system may include 7 thresholds 420 and use one or more counters to adjust the thresholds 420 as described herein with reference to FIGS. 6 and 7.

Figure 5:
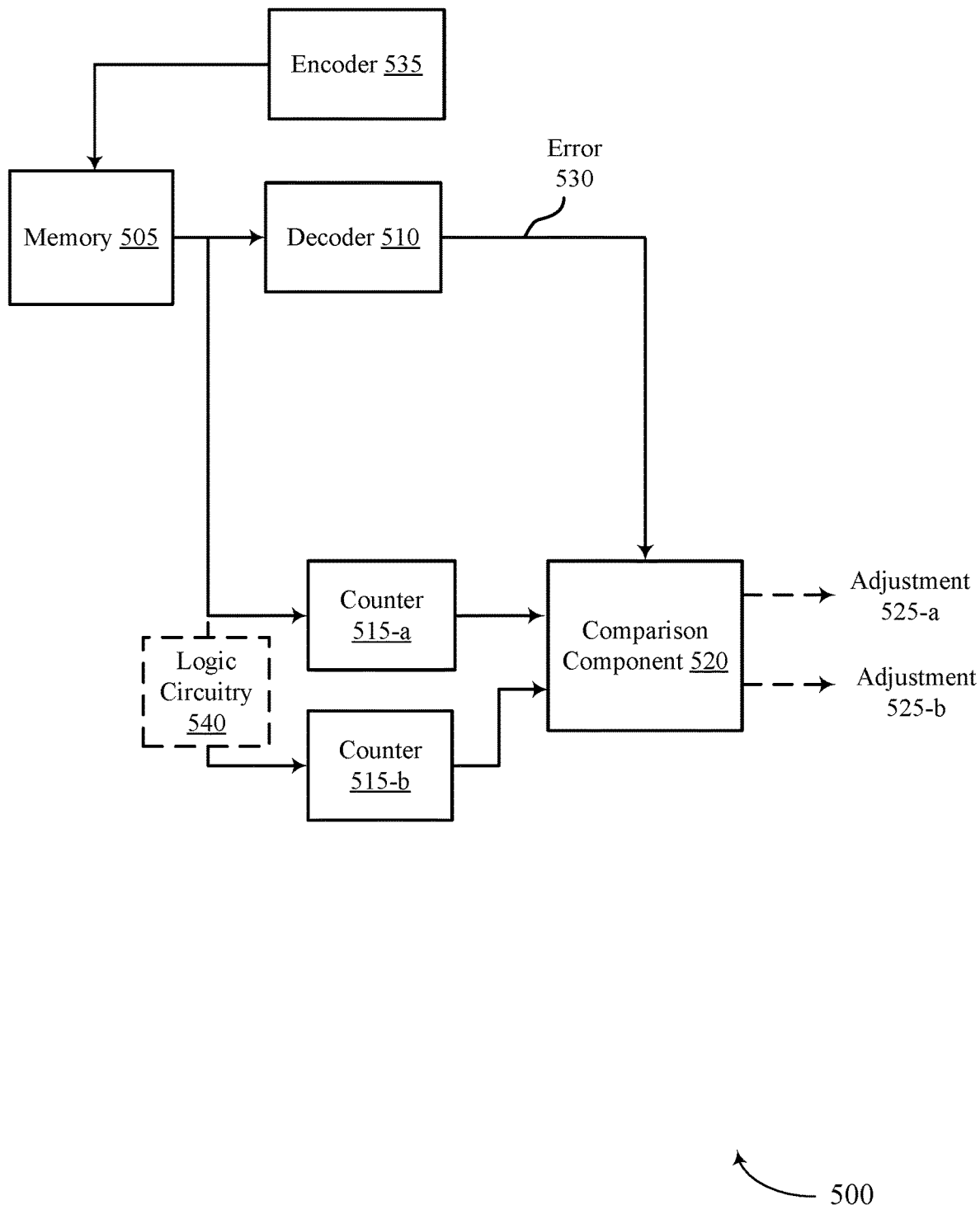
FIG. 5 illustrates an example of a system that supports read threshold adjustment techniques for non-binary memory cells in accordance with examples as disclosed herein.

FIG. 5 illustrates an example of a system 500 that supports read threshold adjustment techniques for non-binary memory cells in accordance with examples as disclosed herein. In some examples, the system 500 may be an example of or include aspects of the system 100, the plot 200, the system 300, and/or the plot 400 as described with reference to FIGS. 1-4. For example, the system 500 may include memory 505, which may be example of a memory array as described herein (e.g., an array of NAND multi-bit memory cells). The system 500 may illustrate an example implementation of adjusting a read threshold using a decoder 510, one or more counters 515, and a comparison component 520. Although shown as separate for illustrative clarity, the various components of the system 500 may be combined or located different than shown (e.g., the decoder 510 may include the counters 515 and the comparison component 520 in logic).

In some examples, the system 500 may include an encoder 535. The encoder 535 may be an example of an encoder as described herein (e.g., an encoder 335). For example, the encoder 535 may be configured to scramble user data into a codeword as described herein with reference to FIGS. 2-4. For example, the encoder 535 may receive user data and generate a balanced sequence of 0's and 1's using a scrambler. The encoder 535 may additionally or alternatively be configured to encode the codeword using an ECC code, to support an error detection or correction procedure if later reading the codeword from the memory 505.

The system 500 may show a data path for performing one or more adjustments 525 of one or more read thresholds using the techniques described herein, including with reference to FIG. 2. For example, data (e.g., a codeword) may be read from the memory 505. The data may be input to the decoder 510. The data may also be input to the counter 515-a, the counter 515-b, or both. The decoder 510 may detect an uncorrectable error 530 in response to decoding the data. Additionally or alternatively, the error 530 may be a quantity of errors that satisfy a threshold (e.g., the memory system may adjust read thresholds if the quantity of errors satisfies a threshold even if the errors are correctable). In some examples, the decoder 510 may include a descrambler in addition or in the alternative to the ECC decoder. For example, the decoder 510 may be configured to descramble the codeword to the original user data as part of the read operation. Additionally or alternatively, the counters 515 may track a quantity of bits in the data that correspond to a first logic value (e.g., the counter 515-a and/or the counter 515-b may increment each time a 1 or a 0 is read from a respective first bit or a respective second bit of a memory cell) or a quantity of memory cells that correspond to a first result output by a set of logic circuitry (e.g., the counter 515-a and/or the counter 515-b may increment each time the logic circuitry outputs a first result or a second result, such as a 1 if the upper page bit and the lower page bit of a memory cells are the same logic value) as described herein, including with reference to FIG. 4.

In some examples, the system 500 may include logic circuitry 540. The logic circuitry 540 may be configured to perform any of the operations ascribed herein to logic circuitry or logic gates in connection with adjusting one or more read thresholds. For example, the logic circuitry 540 may include a logic gate (e.g., an XNOR logic gate) configured to receive one or more inputs (e.g., a respective upper bit and a respective lower bit read from each memory cell associated with a codeword) and output a corresponding result (e.g., a 1 to the counter 515-b) indicating whether the two inputs are the same or different, among other possibilities.

The comparison component 520 may receive an indication of a quantity of bits from the one or more counters 515, an indication that the data includes an uncorrectable error 530 from the decoder 510, or any combination thereof. For example, if the decoder 510 detects that the errors 530 in the data are uncorrectable (e.g., the data includes an uncorrectable quantity of errors for an ECC scheme), the decoder 510 may indicate the error 530 to the comparison component 520. The comparison component 520 may compare the quantity of bits to a second quantity of bits (e.g., a quantity of 0s to a quantity of 1s) or a threshold as described herein, including with reference to FIG. 4. Additionally or alternatively, the comparison component 520 or another component may determine a linear combination of the first counter 515-a and the counter 515-b and use the result to determine the direction or magnitude of an adjustment 525.

The memory system may perform an adjustment 525 in response to a result from the comparison component 520. For example, if the comparison component 520 indicates that the read thresholds are relatively too far from an ideal read threshold location as described herein, the memory system may select a direction of adjustment, a magnitude of adjustment, or both in accordance with the magnitude and direction of the count (e.g., to reduce the quantity of bits being incorrectly read as part of another distribution due to a current location of the read thresholds, among other examples as described herein with reference to FIG. 4). In such examples, the memory system may perform adjustment 525-a (e.g., the memory system may shift one or more thresholds to the left), an adjustment 525-b (e.g., the memory system may shift one or more thresholds to the right), a combination thereof as described with reference to FIG. 4.

In some examples, the system 500 may include one or more additional counters 515. For example, the system 500 may include a counter 515 for each read threshold as described with reference to FIG. 4 (e.g., for MLC, the system 500 may include 3 counters 515). In some such examples, the system may not include logic circuitry 540 (e.g., each counter 515 may be incremented if a 1 or a 0 is read for a respective read threshold). In such cases where the read thresholds are treated separately, the comparison component 520 may perform operations described with reference to FIG. 4. For example, the comparison component 520 may iteratively adjust the values of the counters 515 to obtain accurate excess counts for each counter 515 and perform an adjustment 525-a or 525-b on a per-threshold basis, among other examples.

Figure 6:
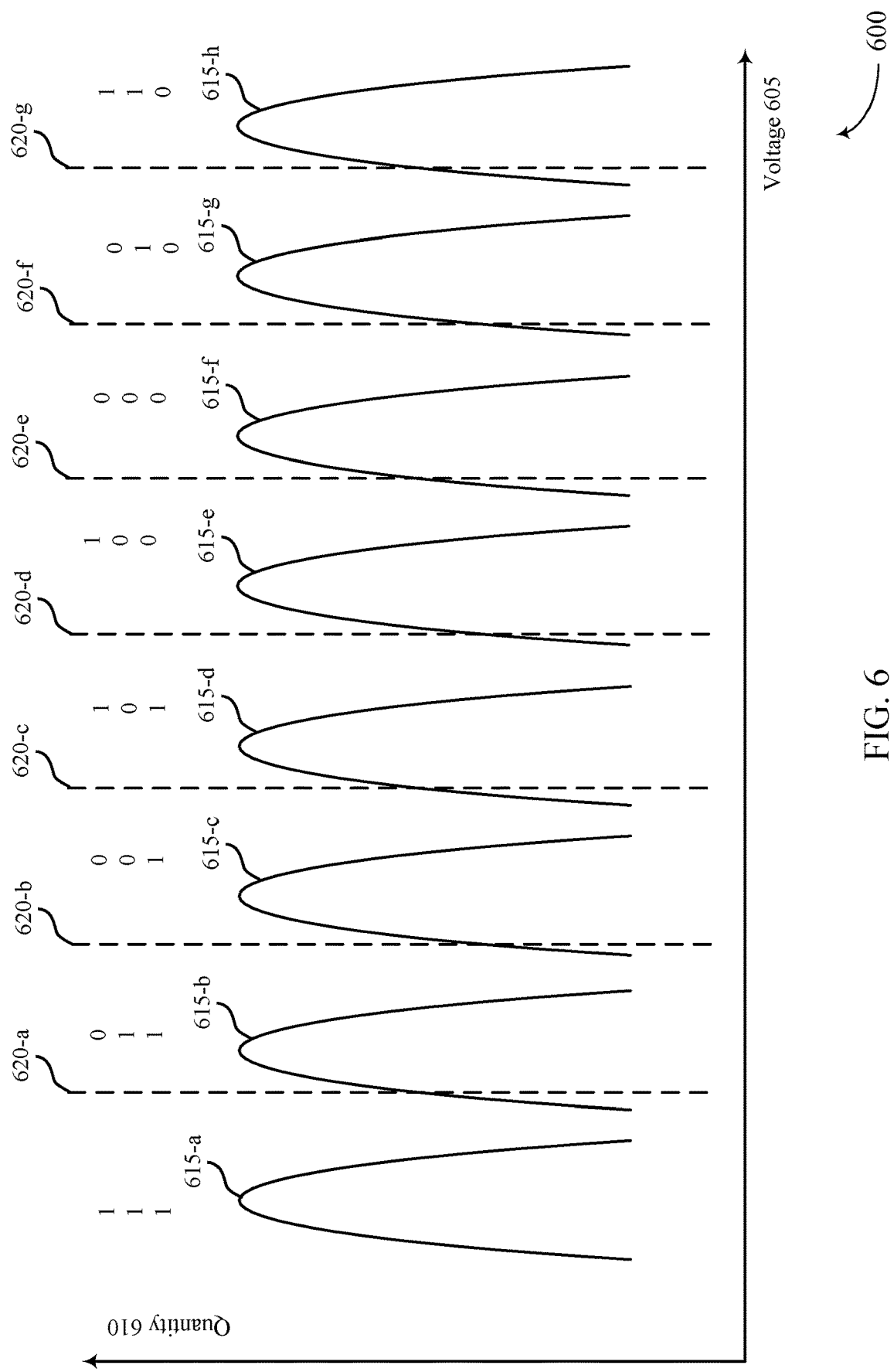
FIG. 6 illustrates a plot of example read distributions that support read threshold adjustment techniques for non-binary memory cells in accordance with examples as disclosed herein.

FIG. 6 illustrates a plot 600 of example read distributions that support read threshold adjustment techniques for non-binary memory cells in accordance with examples as disclosed herein. The plot 600 may be an example of operations implemented by a system 100 as described with reference to FIG. 1. The plot 600 may implement aspects of the plots and systems described herein, such as the plot 400 and system 500 as described with reference to FIGS. 4 and 5, respectively. Generally, the plot 600 may illustrate example distributions 615 for TLC data in a memory array. As an illustrative example, the plot 600 shows thresholds 620 and distributions 615 for memory cells storing three bits on three levels, although aspects of the teachings herein may be extended to memory cells each storing any quantity of bits.

The plot 600 may include a read threshold 620-a, a read threshold 620-b, a read threshold 620-c, a read threshold 620-d, a read threshold 620-e, a read threshold 620-f and a read threshold 620-g, which may be examples of voltage thresholds, though current thresholds or charge thresholds may additional or alternatively be used. A memory system may read memory cells using the read thresholds 620. For example, the memory system may compare a voltage of a signal generated in response to reading a memory cell to the read thresholds 620 and identify a logic value in response to comparing the voltage.

In some examples, the different thresholds 620 may be associated with respective bits stored in the memory cell. As an example of a TLC memory cell storing three bits, the threshold 620-d may be associated with a respective first bit of the memory cell, which may be referred to as a "lower bit" or a "lower page bit" of the memory cell. In some cases, the threshold 620-d may be referred to as a "lower page threshold" or a "lower level threshold." The threshold 620-b and the threshold 620-f may be associated with a respective second bit of the memory cell, which may be referred to as an "upper bit" or an "upper page bit" of the memory cell. In some cases, the thresholds 620-*b* and 620-*f* may be referred to as "upper page thresholds" or "upper level thresholds." The thresholds 620-*a*, 620-*c*, 620-*e*, and 620-*g* may be associated with a respective third bit of the memory cell, which may be referred to as an "extra bit" or an "extra page bit" of the memory cell. In some cases, the thresholds 620-*a*, 620-*c*, 620-*e*, and 620-*g* may be referred to as "extra page thresholds" or "extra level thresholds." Additionally or alternatively, the lower level may be referred to as a first level, the upper level may be referred to as a second level, and the extra level may be referred to as a third level.

Although shown as each distribution 615 corresponding to a set of three bits (e.g., the distribution 615-*a* corresponding to a lower page, upper page, and extra page bits of 1, 1, and 1, respectively), it is to be understood that any layout or orientation of bits and distributions may be used. In some examples, the logic values, distributions 615, and read thresholds 620 may be different than described (e.g., distributions 615 and read thresholds 620 may be associated with different logic values, lower page bits, or upper page bits). Although shown as parabolic curves for illustrative clarity, it is to be understood that the distributions 615 may be any shape or associated with any logic value.

In the example shown, if a voltage signal of a memory cell is less than the threshold 620-*d* the memory cell may read the respective first bit (e.g., lower page bit) as a 1. The memory system may read the respective second bit (e.g., upper page bit) using the read threshold 620-*b* if the respective first bit is 1. For example, the memory system may read the second bit as a 1 if the voltage signal is less than the threshold 620-*b* and a 0 if the voltage signal is greater than the threshold 620-*b*. The memory system may read the respective third bit (e.g., extra page bit) using the read threshold 620-*a* if the respective second bit is 1. For example, the memory system may read the third bit as a 1 if the voltage signal is less than the threshold 620-*a* and a 0 if the signal is greater than the thresholds 620-*a*.

In some examples, one or more of the distributions 615 may become shifted over time such that the one or more read thresholds 620 deviate from an ideal read threshold, which may result in one or more errors in the data as described herein. Accordingly, the memory system may adjust one or more read thresholds 620 using one or more counters.

In some examples, for multi-bit cells (e.g., MLC, TLC, QLC, etc.) configured to store two or more bits of information, the memory system may implement multiple counters. In the example of a TLC cell shown in FIG. 6, in some cases the memory system may use a set of counters associated with each level of the memory cells. For example, a first counter may correspond to the first level (e.g., read threshold 620-*d*), a second counter may correspond to the second level (e.g., read thresholds 620-*b* and 620-*f*), and a third counter may correspond to the third level (e.g., read thresholds 620-*a*, 620-*c*, 620-*e*, and 620-*g*).

The memory system may use an algorithm as described herein with reference to FIG. 4, but extended and adapted to accommodate an additional level, to increment the counters and determine a direction, magnitude, or both to adjust the read thresholds 620 using a linear combination of the three counters. For example, the memory system may increment the first counter to track a quantity of memory cells storing a lower page bit logic value of 1 to obtain the lower page excess 1s. The memory system may increment the second counter using a logic gate as described herein (e.g., a XOR or XNOR logic gate). By using a logic gate, the second counter may indicate a quantity of cells storing an upper bit logic value to the right (or left) of the thresholds 620-*b* and 620-*f* Similarly, the memory system may increment the third counter such that the third counter indicates a quantity of cells storing an extra bit logic value to the right (or left) of the thresholds 620-*a*, 620-*c*, 620-*e*, and 620-*g*. The memory system may obtain a first count associated with the first counter indicating excess 1s of the lower level, a second count associated with a second counter indicating excess 1s in the upper level, and a third count associated with the third counter indicating excess 1s in the extra level. For example, the memory system may perform a linear combination of the values indicated by the counters which will indicate the total number of excess 1s across all of the bit levels. For example, the first count may be the value of the counter, the second count may be the value of the second counter multiplied by two, a third count may be the value of a third counter multiplied by four, and so on. The resulting value (e.g., the linear combination) may be used to determine which direction or magnitude to shift all of the thresholds 620. Although described as using a linear combination for a total count, it is to be understood any technique may be used to evaluate the values indicated by the counters associated with each level of the memory cells.

Additionally or alternatively, the memory system may use a set of counters respectively associated with a set of read thresholds 620. In other words, each counter of the set of counters may correspond to a respective read threshold 620 of the set of read thresholds 620 (e.g., the memory system may use seven counters in plot 600 for TLC memory cells). The memory system may adjust the count of each counter iteratively as described herein with reference to FIG. 4. For example, the memory system may determine an edge read threshold 620-*a* count (or a count of the other edge read threshold 620-*g*). The edge threshold counts may be accurate because any bits incorrectly read are lost to the next distribution or gained from the next distribution (e.g., an accurate quantity of excess 1s or 0s may be obtained due to a single source of extra 1s or 0s). The memory system may use the count of the edge read thresholds to obtain an accurate count for the next read thresholds 620. For example, the memory system may subtract excess 1s of the counter for the read threshold 620-*a* from the counter of the read threshold 620-*b*. By accounting for the excess (or dearth) of logic values from the edge threshold, an accurate count may be obtained for the counter of the read threshold 620-*b*. The memory system may iterate such procedures for each read threshold 62, which may enable the memory system to treat each read threshold 620 separately (e.g., the memory system may use each individual adjusted count to select a direction or magnitude of adjustment for each read threshold 620).

In some examples, the memory system may determine counts for each counter in the set of counters (e.g., each counter that corresponds to a respective read threshold 620) based on a subset of memory cells. For example, each read threshold 620 may correspond to a different logic value for one of multiple levels in a memory cell. That is, for a respective read threshold 620, a single level of a memory cell may change logic value depending on which side of the read threshold 620 the voltage lies (e.g., the other levels of the cell may not change logic value for the read threshold 620). In other words, the other levels of the memory cell may be constant and one of the levels may be changeable when moving across the read threshold 620. In some such examples, the memory system may select a subset of memory cells to determine a count for a counter that corresponds to a respective read threshold 620. For example, the memory system may analyze (e.g., look at) memory cells that have one or more levels with logic values that are constant for the respective read threshold 620. The memory system may determine a count of the subset of memory cells that have a first logic value or a second logic value for the level that is not constant with respective to the read threshold 620. As an illustrative example, for the read threshold 620-b, the lower bit and the extra bit may be a same value of 1 and 0, respectively, regardless of whether the voltage lies on the left or right of the read threshold 620-b. The memory system may select memory cells that have a lower bit value of 1 and an extra bit value of 0 to determine the count associated with the read threshold 620-b. For example, the memory system may determine how many upper bits have a first logic value (e.g., 1 or 0) from the subset of memory cells with a lower bit value of 1 and an extra bit value of 0. In some cases, the memory system may perform such counts for each counter (e.g., each read threshold 620) and adjust the counts as described herein (e.g., using the edge threshold counts and adjusting each count iteratively).

While shown as three bits per cell for illustrative clarity, it is to be understood that the concepts described herein with reference to FIG. 6 and elsewhere may be extended and implemented for other cell types storing any quantity of bits (e.g., other multi-bit cells, such as QLC).

Figure 7:
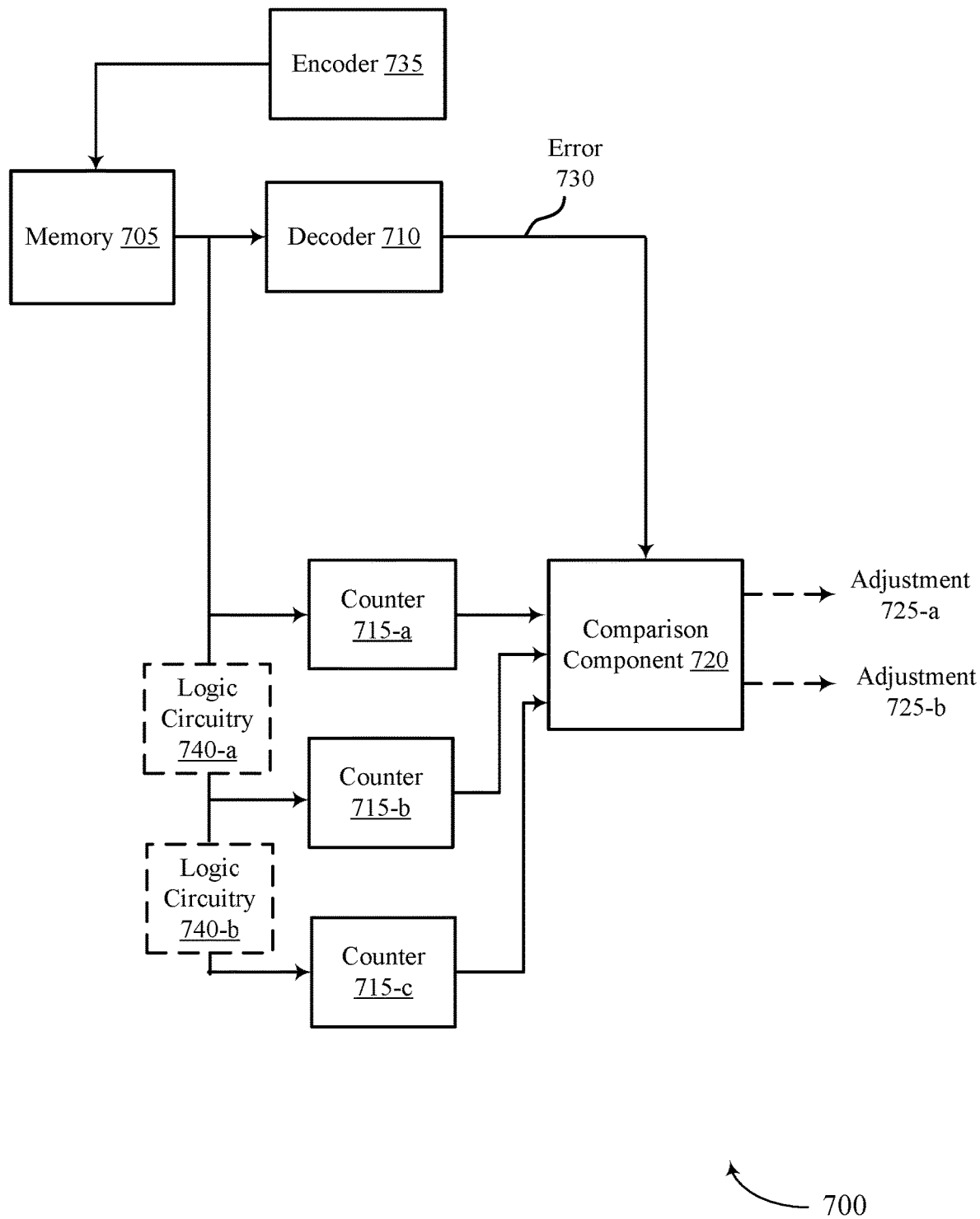
FIG. 7 illustrates an example of a system that supports read threshold adjustment techniques for non-binary memory cells in accordance with examples as disclosed herein.

FIG. 7 illustrates an example of a system 700 that supports read threshold adjustment techniques for non-binary memory cells in accordance with examples as disclosed herein. In some examples, the system 700 may be an example of or include aspects of the systems and plots as described with reference to FIGS. 1-6. For example, the system 700 may include memory 705, which may be example of a memory array as described herein (e.g., an array of NAND multi-bit memory cells). The system 700 may illustrate an example implementation of adjusting a read threshold using a decoder 710, one or more counters 715, and a comparison component 720. Although shown as separate for illustrative clarity, the various components of the system 700 may be combined or located different than shown (e.g., the decoder 710 may include the counters 715 and the comparison component 720 in logic).

In some examples, the system 700 may include an encoder 735. The encoder 735 may be an example of an encoder as described herein (e.g., an encoder 335). For example, the encoder 735 may be configured to scramble user data into a codeword as described herein with reference to FIGS. 2-6. For example, the encoder 735 may receive user data and generate a balanced sequence of 0's and 1's using a scrambler. The encoder 735 may additionally or alternatively be configured to encode the codeword in response to an ECC code, to support an error detection or correction procedure if later reading the codeword from the memory 705.

The system 700 may show a data path for performing one or more adjustments 725 of one or more read thresholds using the techniques described herein, including with reference to FIG. 6. For example, data (e.g., a codeword) may be read from the memory 705. The data may be input to the decoder 710. The data may also be input to the counter 715-a, the counter 715-b, and the counter 715-c. The counters 715 may be examples of a first counter, second counter, and third counter as described with reference to FIG. 6.

The decoder 710 may detect an uncorrectable error 730 in response to decoding the data. Additionally or alternatively, the error 730 may be a quantity of errors that satisfy a threshold (e.g., the memory system may adjust read thresholds if the quantity of errors satisfies a threshold even if the errors are correctable). In some examples, the decoder 710 may include a descrambler in addition or in the alternative to the ECC decoder. For example, the decoder 710 may be configured to descramble the codeword to the original user data as part of the read operation. Additionally or alternatively, the counters 715 may track a quantity of bits in the data that correspond to a first logic value (e.g., the counters 715 may increment each time a 1 or a 0 is read from a respective first bit, a respective second bit, or a respective third bit of a memory cell) or a quantity of memory cells that correspond to a first result output by a set of logic circuitry (e.g., the counter 715-b and/or the counter 715-c may increment each time the logic circuitry outputs a first result or a second result, such as a XOR or XNOR result of the three bits) as described herein, including with reference to FIGS. 4 and 6.

In some examples, the system 700 may include logic circuitry 740. The logic circuitry 740 may be configured to perform any of the operations ascribed herein to logic circuitry or logic gates in connection with adjusting one or more read thresholds. For example, the logic circuitry 740-a may include a logic gate (e.g., an XNOR logic gate) configured to receive one or more inputs (e.g., a respective upper bit and a respective lower bit read from each memory cell) and output a corresponding result (e.g., a 1 to the counter 715-b) indicating whether the two inputs are the same or different, among other possibilities. The logic circuitry 740-b may include a logic gate (e.g., a XOR logic gate) configured to receive one or more inputs (e.g., a respective upper bit, a respective lower bit, and a respective extra bit read from each memory cell) and output a corresponding result (e.g., a 1 to the counter 715-c) indicating whether the two inputs are the same or different, among other possibilities.

The comparison component 720 may receive an indication of a quantity of bits from the one or more counters 715, an indication that the data includes an uncorrectable error 730 from the decoder 710, or any combination thereof. For example, if the decoder 710 detects that the errors 730 in the data are uncorrectable (e.g., the data includes an uncorrectable quantity of errors for an ECC scheme), the decoder 710 may indicate the error 730 to the comparison component 720. The comparison component 720 may compare the quantity of bits to a second quantity of bits (e.g., a quantity of 0s to a quantity of 1s) or a threshold as described herein, including with reference to FIG. 4. Additionally or alternatively, the comparison component 720 or another component may determine a linear combination of the first counter 715-a and the counter 715-b and use the result to determine the direction or magnitude of an adjustment 725, as described with reference to FIGS. 4 and 6.

The memory system may perform an adjustment 725 in response to a result from the comparison component 720. For example, if the comparison component 720 indicates that the read thresholds are relatively too far from an ideal read threshold location as described herein, the memory system may select a direction of adjustment, a magnitude of adjustment, or both in accordance with the magnitude and direction of the count (e.g., to reduce the quantity of bits being incorrectly read as part of another distribution due to a current location of the read thresholds, among other examples as described herein with reference to FIG. 4). In such examples, the memory system may perform adjustment 725-a (e.g., the memory system may shift one or more thresholds to the left), an adjustment 725-b (e.g., the memory system may shift one or more thresholds to the right), a combination thereof as described with reference to FIGS. 4 and 6.

In some examples, the system 700 may include one or more additional counters 715. For example, the system 700 may include a counter 715 for each read threshold as described with reference to FIG. 4 or 6 (e.g., for TLC, the system 700 may include 7 counters 715). In some such examples, the system may not include logic circuitry 740 (e.g., each counter 715 may be incremented if a 1 or a 0 is read for a respective read threshold). In such cases where the read thresholds are treated separately, the comparison component 720 may perform operations described with reference to FIGS. 4 and 6. For example, the comparison component 720 may iteratively adjust the values of the counters 715 to obtain accurate excess counts for each counter 715 and perform an adjustment 725-*a* or 725-*b* on a per-threshold basis, among other examples.

Figure 8:
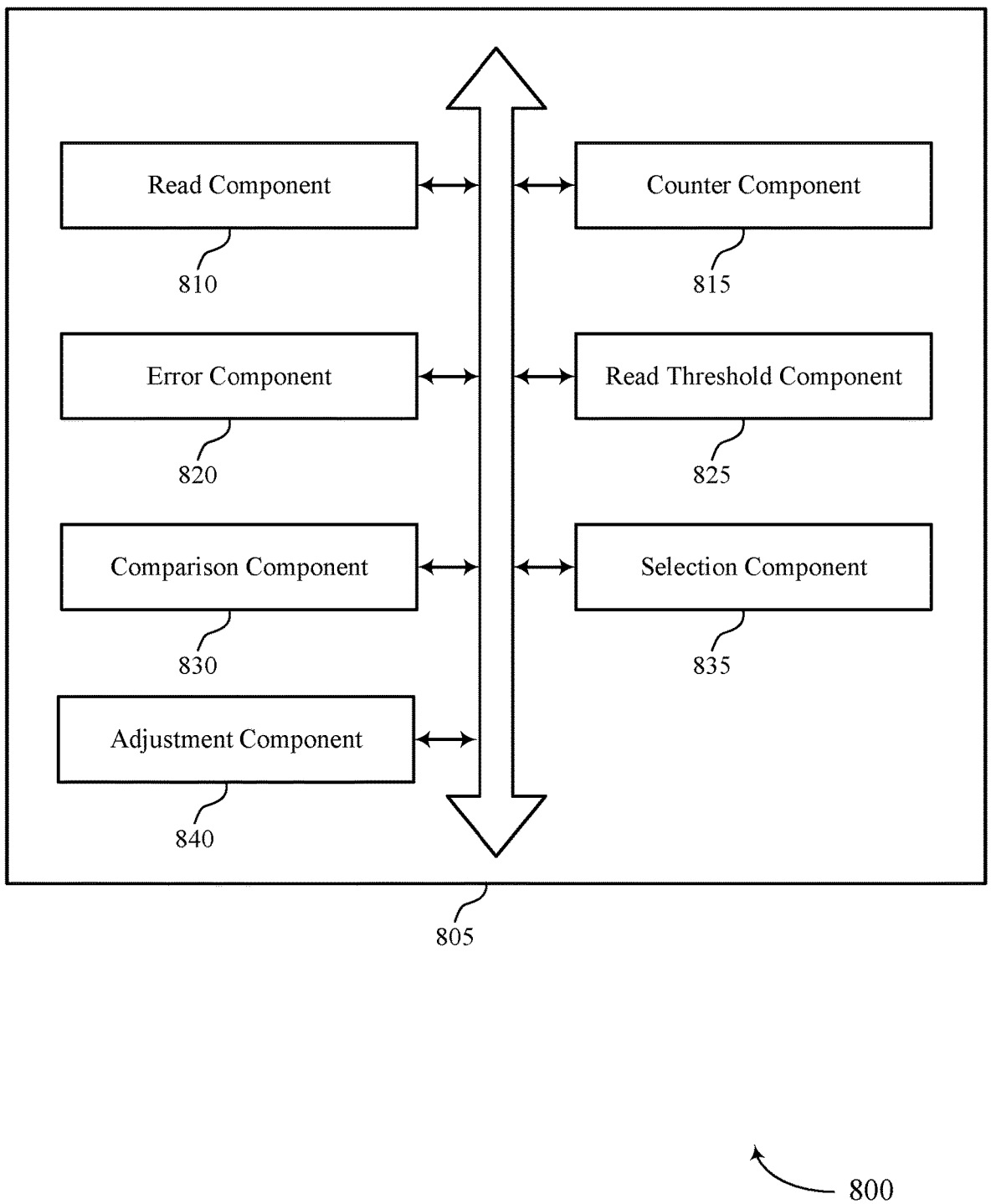
FIG. 8 shows a block diagram of a memory device that supports read threshold adjustment techniques for non-binary memory cells in accordance with examples as disclosed herein.

FIG. 8 illustrates an example of a block diagram 800 that supports read threshold adjustment techniques for non-binary memory cells in accordance with examples as disclosed herein. The memory system 805 may be an example of aspects of a memory system as described with reference to FIGS. 1-7. In some examples, the memory system 805 may be referred to as a memory device or may include one or more memory devices. The memory system 805 may include a read component 810, a counter component 815, an error component 820, a read threshold component 825, a comparison component 830, a selection component 835, and an adjustment component 840. Each of these modules may communicate, directly or indirectly, with one another (e.g., via one or more buses).

The read component 810 may be configured as or otherwise support a means for reading a codeword from a memory array of one or more memory devices using a read threshold having a first value. The counter component 815 may be configured as or otherwise support a means for incrementing a counter of the one or more memory devices in response to reading the codeword, the counter indicating a quantity of bits of the codeword that correspond to a first logic value. The error component 820 may be configured as or otherwise support a means for detecting an error in the codeword after reading the codeword. The read threshold component 825 may be configured as or otherwise support a means for adjusting the read threshold from the first value to a second value in response to the quantity of bits indicated by the counter. The read component 810 may be configured as or otherwise support a means for reading the codeword from the memory array using the read threshold having the second value.

The comparison component 830 may be configured as or otherwise support a means for comparing the quantity of bits of the codeword that correspond to the first logic value to a second quantity of bits of the codeword that correspond to a second logic value, where adjusting the read threshold from the first value to the second value is in response to the comparison. In some examples, the selection component 835 may be configured as or otherwise support a means for selecting a direction of adjustment, a magnitude of adjustment, or both associated with adjusting the read threshold in response to the comparison. In some examples, the read threshold component 825 may be configured as or otherwise support a means for adjusting the read threshold from the first value to the second value in accordance with the selected direction of adjustment, the magnitude of adjustment, or both.

In some examples, the comparison component 830 may be configured as or otherwise support a means for determining that the quantity of bits of the codeword that correspond to the first logic value satisfies a threshold in response to the comparing. The selection component 835 may be configured as or otherwise support a means for selecting a direction of adjustment, a magnitude of adjustment, or both associated with adjusting the read threshold in response to the satisfied threshold.

In some examples, the read threshold component 825 may be configured as or otherwise support a means for adjusting the read threshold by a magnitude, a direction, or both, where the magnitude, the direction, or both correspond to the quantity of bits indicated by the counter.

The error component 820 may be configured as or otherwise support a means for determining that the error is an uncorrectable error for an error correction code scheme, where detecting the error is in response to the error correction code scheme, and where adjusting the read threshold is in response to the error being the uncorrectable error for the error correction code scheme.

In some examples, the read threshold includes a voltage threshold, a current threshold, a charge threshold, or any combination thereof.

In some examples, the error component 820 may be configured as or otherwise support a means for detecting a second error in the codeword based at least in part on reading the codeword using the read threshold having the second value. The read threshold component 825 may be configured as or otherwise support a means for adjusting the read threshold from the second value to a third value on the detected second error.

In some examples, the read component 810 may be configured as or otherwise support a means for reading data from a set of memory cells within the one or more memory devices using at least three read thresholds, each memory cell of the set of memory cells configured to store a respective plurality of bits each corresponding to a respective level of a plurality of levels each corresponding to a respective subset of read thresholds of the at least three read thresholds. The counter component 815 may be configured as or otherwise support a means for incrementing each counter of a set of counters based at least in part on reading the data, the set of counters including a first counter corresponding to a first level of the plurality of levels and a second counter corresponding to a second level of the plurality of levels. The error component 820 may be configured as or otherwise support a means for detecting an error in the data based at least in part on reading the data using the at least three read thresholds. The read threshold component 825 may be configured as or otherwise support a means for adjusting one or more of the at least three read thresholds based at least in part on the set of counters. In some examples, the read component 810 may be configured as or otherwise support a means for reading the data from the memory array after adjusting the one or more of the at least three read thresholds.

In some examples, to support incrementing each counter of the set of counters, the counter component 815 may be configured as or otherwise support a means for incrementing the first counter corresponding to the first level, the first counter indicating a quantity of bits stored by the set of memory cells that correspond to a first logic value. In some examples, to support incrementing each counter of the set of counters, the counter component 815 may be configured as or otherwise support a means for incrementing the second counter corresponding to the second level, the second counter indicating a quantity of outputs from one or more logic gates corresponding to a particular logic value.

In some examples, the inputs to the one or more logic gates include a first bit stored by a first memory cell and a second bit stored by the first memory cell, the first bit corresponding to the first level and the second bit corresponding to the second level.

In some examples, to support incrementing each counter of the set of counters, the counter component 815 may be configured as or otherwise support a means for incrementing a third counter corresponding to a third level of the plurality of levels, the third counter indicating a second quantity of outputs from the one or more logic gates corresponding to a particular logic value, where the inputs to the one or more logic gates include a first bit stored by a first memory cell, a second bit stored by the first memory cell, and a third bit stored by the first memory cell. In some examples, to support incrementing each counter of the set of counters, the counter component 815 may be configured as or otherwise support a means for where the first bit corresponds to the first level, the second bit corresponds to the second level, and the third bit corresponds to the third level.

In some examples, the counter component 815 may be configured as or otherwise support a means for determining a quantity of bits that correspond to a first logic value based at least in part on a combination of counts, each of the counts indicated by a respective counter of the set of counters. In some examples, the combination of counts includes a linear combination of a first count indicated by the first counter, a second count indicated by the second counter, a third count indicated by a third counter, a fourth count indicated by a fourth counter, or any combination thereof.

In some examples, a direction, a magnitude, or both of the adjusting of the at least three read thresholds is based at least in part on the quantity of bits that correspond to the first logic value. In some examples, to support adjusting, the read threshold component 825 may be configured as or otherwise support a means for adjusting the at least three read thresholds in a direction indicated by the set of counters. In some examples, to support adjusting, the read threshold component 825 may be configured as or otherwise support a means for adjusting the at least three read thresholds by a magnitude indicated by the set of counters.

In some examples, the selection component 835 may be configured as or otherwise support a means for selecting a direction of adjustment, a magnitude of adjustment, or both associated with the adjusting of the one or more of the at least three read thresholds based at least in part on the set of counters.

In some examples, the error component 820 may be configured as or otherwise support a means for detecting a second error in the data based at least in part on reading the data from the memory array after adjusting the one or more of the at least three read thresholds. In some examples, the read threshold component 825 may be configured as or otherwise support a means for readjusting the one or more of the at least three read thresholds based at least in part on detecting the second error. In some examples, the at least three read thresholds each include a respective voltage threshold, a respective current threshold, or any combination thereof.

In some examples, the read component 810 may be configured as or otherwise support a means for reading data from a set of memory cells within the one or more memory devices using at least three read thresholds, each memory cell of the set of memory cells configured to store at least two bits. In some examples, the counter component 815 may be configured as or otherwise support a means for incrementing each counter of a set of counters based at least in part on reading the data using the at least three read thresholds, where each counter of the set of counters corresponds to a respective read threshold of the at least three read thresholds and indicates a respective quantity of bits of the data corresponding to a first logic value. The adjustment component 840 may be configured as or otherwise support a means for adjusting a first quantity indicated by a first counter of the set of counters using a second quantity indicated by a second counter of the set of counters. In some examples, the read threshold component 825 may be configured as or otherwise support a means for adjusting, after adjusting the first quantity indicated by the first counter, one or more of the at least three read thresholds based at least in part on the set of counters. In some examples, the read component 810 may be configured as or otherwise support a means for reading the data from the memory array after adjusting the one or more of the at least three read thresholds.

In some examples, the counter component 815 may be configured as or otherwise support a means for determining the first quantity indicated by the first counter, the first quantity indicating a quantity of bits for a first respective threshold of the at least three read thresholds that correspond to the first logic value. In some examples, the counter component 815 may be configured as or otherwise support a means for determining the second quantity indicated by the second counter, the second quantity indicating a quantity of bits for a second respective threshold of the at least three read thresholds that correspond to the first logic value.

In some examples, to support adjusting the first quantity, the adjustment component 840 may be configured as or otherwise support a means for subtracting the second quantity from the first quantity. In some examples, the adjustment component 840 may be configured as or otherwise support a means for adjusting a third quantity indicated by a third counter of the set of counters based at least in part on the first quantity, the second quantity, or both.

In some examples, the read threshold component 825 may be configured as or otherwise support a means for adjusting a first threshold of the at least three read thresholds in a direction indicated by the first counter, a second threshold of the at least three read thresholds in a direction indicated by the second counter, a third threshold of the at least three read thresholds in a direction indicated by a third counter, a fourth threshold of the at least three read thresholds in a direction indicated by a fourth counter, or any combination thereof.

In some examples, the read threshold component 825 may be configured as or otherwise support a means for adjusting a first threshold of the at least three read thresholds by a magnitude indicated by the first counter, a second threshold of the at least three read thresholds by a magnitude indicated by the second counter, a third threshold of the at least three read thresholds by a magnitude indicated by a third counter, a fourth threshold of the at least three read thresholds by a magnitude indicated by a fourth counter, or any combination thereof.

In some examples, the read threshold component 825 may be configured as or otherwise support a means for selecting a subset of memory cells from the set of memory cells for each read threshold of the at least three read thresholds, where a respective subset of memory cells corresponds to a respective read threshold and a respective counter, and incrementing the respective counter based on a quantity of the respective subset of memory cells that correspond to the first logic state.

Figure 9:
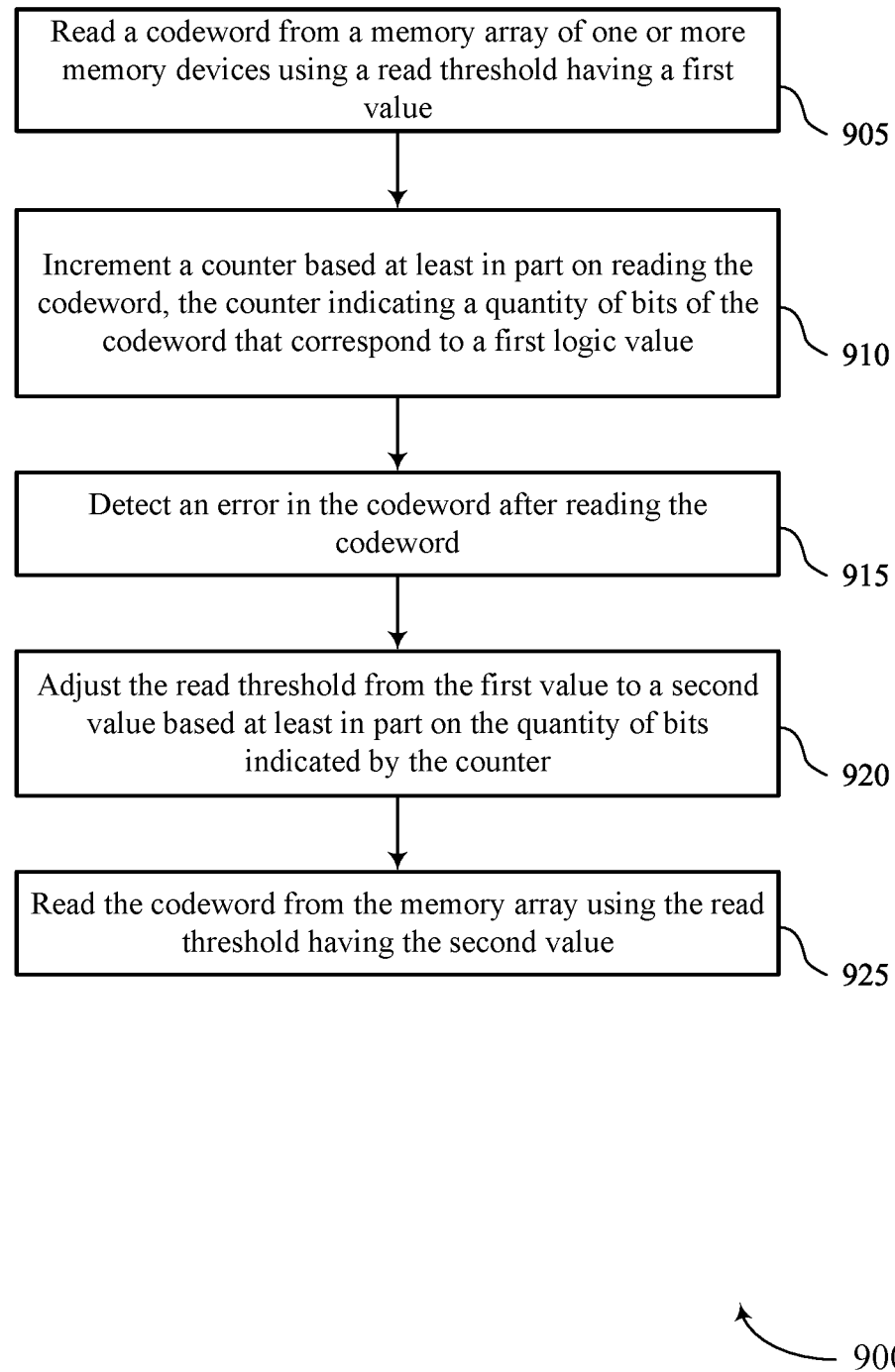
FIGS. 9-11 show flowcharts illustrating a method or methods that support read threshold adjustment techniques for non-binary memory cells in accordance with examples as disclosed herein.

FIG. 9 shows a flowchart illustrating a method 900 that supports read threshold adjustment techniques for non-binary memory cells in accordance with examples as disclosed herein. The operations of method 900 may be implemented by a memory system or its components as described herein. For example, the operations of method 900 may be performed by a memory system as described with reference to FIGS. 1 through 8. In some examples, a memory system may execute a set of instructions to control the functional elements of the device to perform the described functions. Additionally or alternatively, the memory system may perform aspects of the described functions using special-purpose hardware.

At 905, the method may include reading a codeword from a memory array of one or more memory devices using a read threshold having a first value. The operations of 905 may be performed in accordance with examples as disclosed herein. In some examples, aspects of the operations of 905 may be performed by a read component 810 as described with reference to FIG. 8.

At 910, the method may include incrementing a counter based at least in part on reading the codeword, the counter indicating a quantity of bits of the codeword that correspond to a first logic value. The operations of 910 may be performed in accordance with examples as disclosed herein. In some examples, aspects of the operations of 910 may be performed by a counter component 815 as described with reference to FIG. 8.

At 915, the method may include detecting an error in the codeword after reading the codeword. The operations of 915 may be performed in accordance with examples as disclosed herein. In some examples, aspects of the operations of 915 may be performed by an error component 820 as described with reference to FIG. 8.

At 920, the method may include adjusting the read threshold from the first value to a second value based at least in part on the quantity of bits indicated by the counter. The operations of 920 may be performed in accordance with examples as disclosed herein. In some examples, aspects of the operations of 920 may be performed by a read threshold component 825 as described with reference to FIG. 8.

At 925, the method may include reading the codeword from the memory array using the read threshold having the second value. The operations of 925 may be performed in accordance with examples as disclosed herein. In some examples, aspects of the operations of 925 may be performed by a read component 810 as described with reference to FIG. 8.

In some examples, an apparatus as described herein may perform a method or methods, such as the method 900. The apparatus may include, features, circuitry, logic, means, or instructions (e.g., a non-transitory computer-readable medium storing instructions executable by a processor) for reading a codeword from a memory array of the one or more memory devices using a read threshold having a first value, incrementing a counter based at least in part on reading the codeword, the counter indicating a quantity of bits of the codeword that correspond to a first logic value, detecting an error in the codeword after reading the codeword, adjusting the read threshold from the first value to a second value based at least in part on the quantity of bits indicated by the counter, and reading the codeword from the memory array using the read threshold having the second value.

Some examples of the method 900 and the apparatus described herein may further include operations, features, circuitry, logic, means, or instructions for comparing the quantity of bits of the codeword that correspond to the first logic value to a second quantity of bits of the codeword that correspond to a second logic value, where adjusting the read threshold from the first value to the second value may be based at least in part on the comparison.

Some examples of the method 900 and the apparatus described herein may further include operations, features, circuitry, logic, means, or instructions for selecting a direction of adjustment, a magnitude of adjustment, or both associated with adjusting the read threshold based at least in part on the comparison.

Some examples of the method 900 and the apparatus described herein may further include operations, features, circuitry, logic, means, or instructions for adjusting the read threshold from the first value to the second value in accordance with the selected direction of adjustment, the magnitude of adjustment, or both.

Some examples of the method 900 and the apparatus described herein may further include operations, features, circuitry, logic, means, or instructions for determining that the quantity of bits of the codeword that correspond to the first logic value satisfies a threshold based at least in part on the comparing and selecting a direction of adjustment, a magnitude of adjustment, or both associated with adjusting the read threshold based at least in part on the satisfied threshold.

Some examples of the method 900 and the apparatus described herein may further include operations, features, circuitry, logic, means, or instructions for adjusting the read threshold may include operations, features, circuitry, logic, means, or instructions for adjusting the read threshold by a magnitude, a direction, or both, where the magnitude, the direction, or both correspond to the quantity of bits indicated by the counter.

Some examples of the method 900 and the apparatus described herein may further include operations, features, circuitry, logic, means, or instructions for determining that the error may be an uncorrectable error for an error correction code scheme, where detecting the error may be based at least in part on the error correction code scheme, and where adjusting the read threshold may be based at least in part on the error being the uncorrectable error for the error correction code scheme.

In some examples of the method 900 and the apparatus described herein, the read threshold may be a voltage threshold, a current threshold, a charge threshold or any combination thereof.

Some examples of the method 900 and the apparatus described herein may further include operations, features, circuitry, logic, means, or instructions for detecting a second error in the codeword based at least in part on reading the codeword using the read threshold having the second value and adjusting the read threshold from the second value to a third value based at least in part on the detected second error.

Figure 10:
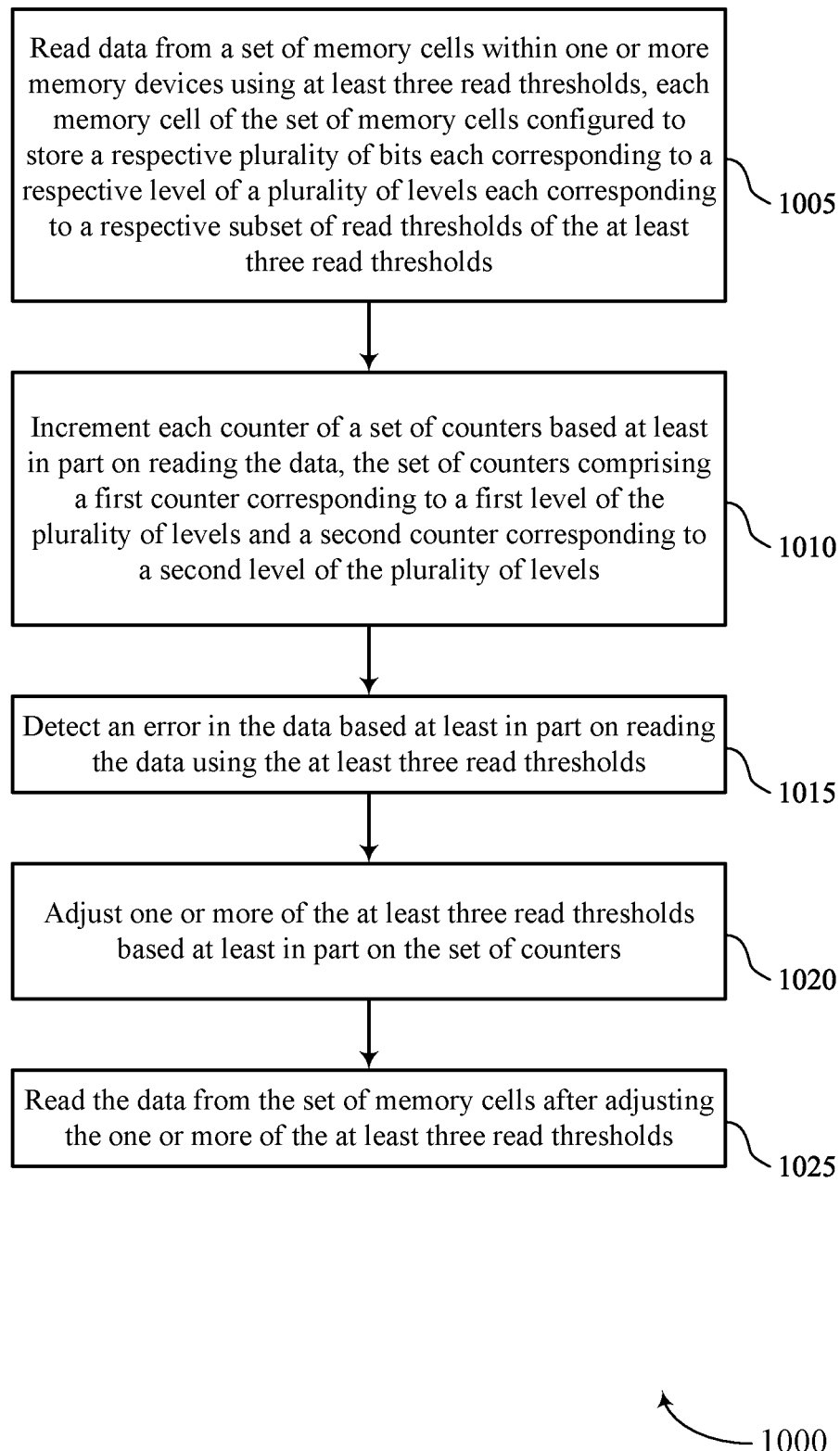

FIG. 10 shows a flowchart illustrating a method 1000 that supports read threshold adjustment techniques for non-binary memory cells in accordance with examples as disclosed herein. The operations of method 1000 may be implemented by a memory system or its components as described herein. For example, the operations of method 1000 may be performed by a memory system as described with reference to FIGS. 1 through 8. In some examples, a memory system may execute a set of instructions to control the functional elements of the device to perform the described functions. Additionally or alternatively, the memory system may perform aspects of the described functions using special-purpose hardware.

At 1005, the method may include reading data from a set of memory cells within one or more memory devices using at least three read thresholds, each memory cell of the set of memory cells configured to store a respective plurality of bits each corresponding to a respective level of a plurality of levels each corresponding to a respective subset of read thresholds of the at least three read thresholds. The operations of 1005 may be performed in accordance with examples as disclosed herein. In some examples, aspects of the operations of 1005 may be performed by a read component 810 as described with reference to FIG. 8.

At 1010, the method may include incrementing each counter of a set of counters based at least in part on reading the data, the set of counters including a first counter corresponding to a first level of the plurality of levels and a second counter corresponding to a second level of the plurality of levels. The operations of 1010 may be performed in accordance with examples as disclosed herein. In some examples, aspects of the operations of 1010 may be performed by a counter component 815 as described with reference to FIG. 8.

At 1015, the method may include detecting an error in the data based at least in part on reading the data using the at least three read thresholds. The operations of 1015 may be performed in accordance with examples as disclosed herein. In some examples, aspects of the operations of 1015 may be performed by an error component 820 as described with reference to FIG. 8.

At 1020, the method may include adjusting one or more of the at least three read thresholds based at least in part on the set of counters. The operations of 1020 may be performed in accordance with examples as disclosed herein. In some examples, aspects of the operations of 1020 may be performed by a read threshold component 825 as described with reference to FIG. 8.

At 1025, the method may include reading the data from the memory array after adjusting the one or more of the at least three read thresholds. The operations of 1025 may be performed in accordance with examples as disclosed herein. In some examples, aspects of the operations of 1025 may be performed by a read component 810 as described with reference to FIG. 8.

In some examples, an apparatus as described herein may perform a method or methods, such as the method 1000. The apparatus may include, features, circuitry, logic, means, or instructions (e.g., a non-transitory computer-readable medium storing instructions executable by a processor) for reading data from a set of memory cells within the one or more memory devices using at least three read thresholds, each memory cell of the set of memory cells configured to store a respective plurality of bits each corresponding to a respective level of a plurality of levels each corresponding to a respective subset of read thresholds of the at least three read thresholds, incrementing each counter of a set of counters based at least in part on reading the data, the set of counters including a first counter corresponding to a first level of the plurality of levels and a second counter corresponding to a second level of the plurality of levels, detecting an error in the data based at least in part on reading the data using the at least three read thresholds, adjusting one or more of the at least three read thresholds based at least in part on the set of counters, and reading the data from the memory array after adjusting the one or more of the at least three read thresholds.

In some examples of the method 1000 and the apparatus described herein, operations, features, circuitry, logic, means, or instructions for incrementing each counter of the set of counters may include operations, features, circuitry, logic, means, or instructions for incrementing the first counter corresponding to the first level, the first counter indicating a quantity of bits stored by the set of memory cells that correspond to a first logic value, and incrementing the second counter corresponding to the second level, the second counter indicating a quantity of outputs from one or more logic gates corresponding to a particular logic value.

In some examples of the method 1000 and the apparatus described herein, the inputs to the one or more logic gates include a first bit stored by a first memory cell and a second bit stored by the first memory cell, the first bit corresponding to the first level and the second bit corresponding to the second level.

In some examples of the method 1000 and the apparatus described herein, operations, features, circuitry, logic, means, or instructions for incrementing each counter of the set of counters may include operations, features, circuitry, logic, means, or instructions for incrementing a third counter corresponding to a third level of the plurality of levels, the third counter indicating a second quantity of outputs from the one or more logic gates corresponding to a particular logic value, where the inputs to the one or more logic gates include a first bit stored by a first memory cell, a second bit stored by the first memory cell, and a third bit stored by the first memory cell, and where the first bit corresponds to the first level, the second bit corresponds to the second level, and the third bit corresponds to the third level.

Some examples of the method 1000 and the apparatus described herein may further include operations, features, circuitry, logic, means, or instructions for determining a quantity of bits that correspond to a first logic value based at least in part on a combination of counts, each of the counts indicated by a respective counter of the set of counters.

In some examples of the method 1000 and the apparatus described herein, the combination of counts includes a linear combination of a first count indicated by the first counter, a second count indicated by the second counter, a third count indicated by a third counter, a fourth count indicated by a fourth counter, or any combination thereof.

In some examples of the method 1000 and the apparatus described herein, a direction, a magnitude, or both of the adjusting of the at least three read thresholds may be based at least in part on the quantity of bits that correspond to the first logic value.

In some examples of the method 1000 and the apparatus described herein, operations, features, circuitry, logic, means, or instructions for the adjusting may include operations, features, circuitry, logic, means, or instructions for adjusting the at least three read thresholds in a direction indicated by the set of counters.

In some examples of the method 1000 and the apparatus described herein, operations, features, circuitry, logic, means, or instructions for the adjusting may include operations, features, circuitry, logic, means, or instructions for adjusting the at least three read thresholds by a magnitude indicated by the set of counters.

Some examples of the method 1000 and the apparatus described herein may further include operations, features, circuitry, logic, means, or instructions for selecting a direction of adjustment, a magnitude of adjustment, or both associated with the adjusting of the one or more of the at least three read thresholds based at least in part on the set of counters.

Some examples of the method 1000 and the apparatus described herein may further include operations, features, circuitry, logic, means, or instructions for detecting a second error in the data based at least in part on reading the data from the memory array after adjusting the one or more of the at least three read thresholds and readjusting the one or more of the at least three read thresholds based at least in part on detecting the second error.

In some examples of the method 1000 and the apparatus described herein, the at least three read thresholds each include a respective voltage threshold, a respective current threshold, or any combination thereof.

Figure 11:
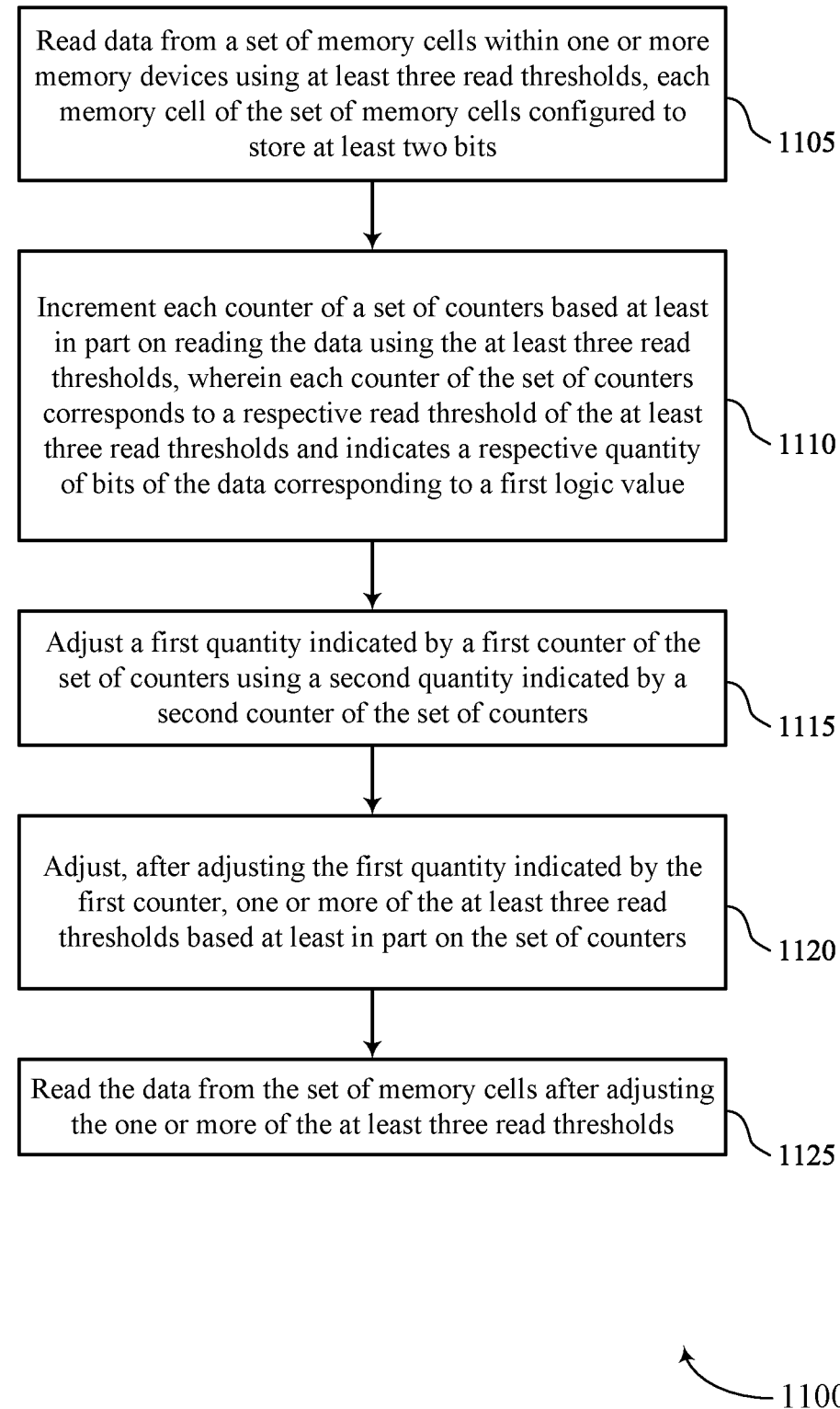

FIG. 11 shows a flowchart illustrating a method 1100 that supports read threshold adjustment techniques for non-binary memory cells in accordance with examples as disclosed herein. The operations of method 1100 may be implemented by a memory system or its components as described herein. For example, the operations of method 1100 may be performed by a memory system as described with reference to FIGS. 1 through 8. In some examples, a memory system may execute a set of instructions to control the functional elements of the device to perform the described functions. Additionally or alternatively, the memory system may perform aspects of the described functions using special-purpose hardware.

At 1105, the method may include reading data from a set of memory cells within one or more memory devices using at least three read thresholds, each memory cell of the set of memory cells configured to store at least two bits. The operations of 1105 may be performed in accordance with examples as disclosed herein. In some examples, aspects of the operations of 1105 may be performed by a read component 810 as described with reference to FIG. 8.

At 1110, the method may include incrementing each counter of a set of counters based at least in part on reading the data using the at least three read thresholds, where each counter of the set of counters corresponds to a respective read threshold of the at least three read thresholds and indicates a respective quantity of bits of the data corresponding to a first logic value. The operations of 1110 may be performed in accordance with examples as disclosed herein. In some examples, aspects of the operations of 1110 may be performed by a counter component 815 as described with reference to FIG. 8.

At 1115, the method may include adjusting a first quantity indicated by a first counter of the set of counters using a second quantity indicated by a second counter of the set of counters. The operations of 1115 may be performed in accordance with examples as disclosed herein. In some examples, aspects of the operations of 1115 may be performed by an adjustment component 840 as described with reference to FIG. 8.

At 1120, the method may include adjusting, after adjusting the first quantity indicated by the first counter, one or more of the at least three read thresholds based at least in part on the set of counters. The operations of 1120 may be performed in accordance with examples as disclosed herein. In some examples, aspects of the operations of 1120 may be performed by a read threshold component 825 as described with reference to FIG. 8.

At 1125, the method may include reading the data from the memory array after adjusting the one or more of the at least three read thresholds. The operations of 1125 may be performed in accordance with examples as disclosed herein. In some examples, aspects of the operations of 1125 may be performed by a read component 810 as described with reference to FIG. 8.

In some examples, an apparatus as described herein may perform a method or methods, such as the method 1100. The apparatus may include, features, circuitry, logic, means, or instructions (e.g., a non-transitory computer-readable medium storing instructions executable by a processor) for reading data from a set of memory cells within the one or more memory devices using at least three read thresholds, each memory cell of the set of memory cells configured to store at least two bits, incrementing each counter of a set of counters based at least in part on reading the data using the at least three read thresholds, where each counter of the set of counters corresponds to a respective read threshold of the at least three read thresholds and indicates a respective quantity of bits of the data corresponding to a first logic value, adjusting a first quantity indicated by a first counter of the set of counters using a second quantity indicated by a second counter of the set of counters, adjusting, after adjusting the first quantity indicated by the first counter, one or more of the at least three read thresholds based at least in part on the set of counters, and reading the data from the memory array after adjusting the one or more of the at least three read thresholds.

Some examples of the method 1100 and the apparatus described herein may further include operations, features, circuitry, logic, means, or instructions for determining the first quantity indicated by the first counter, the first quantity indicating a quantity of bits for a first respective threshold of the at least three read thresholds that correspond to the first logic value, and determining the second quantity indicated by the second counter, the second quantity indicating a quantity of bits for a second respective threshold of the at least three read thresholds that correspond to the first logic value.

In some examples of the method 1100 and the apparatus described herein, operations, features, circuitry, logic, means, or instructions for adjusting the first quantity may include operations, features, circuitry, logic, means, or instructions for subtracting the second quantity from the first quantity.

Some examples of the method 1100 and the apparatus described herein may further include operations, features, circuitry, logic, means, or instructions for adjusting a third quantity indicated by a third counter of the set of counters based at least in part on the first quantity, the second quantity, or both.

Some examples of the method 1100 and the apparatus described herein may further include operations, features, circuitry, logic, means, or instructions for adjusting a first threshold of the at least three read thresholds in a direction indicated by the first counter, a second threshold of the at least three read thresholds in a direction indicated by the second counter, a third threshold of the at least three read thresholds in a direction indicated by a third counter, a fourth threshold of the at least three read thresholds in a direction indicated by a fourth counter, or any combination thereof.

Some examples of the method 1100 and the apparatus described herein may further include operations, features, circuitry, logic, means, or instructions for adjusting a first threshold of the at least three read thresholds by a magnitude indicated by the first counter, a second threshold of the at least three read thresholds by a magnitude indicated by the second counter, a third threshold of the at least three read thresholds by a magnitude indicated by a third counter, a fourth threshold of the at least three read thresholds by a magnitude indicated by a fourth counter, or any combination thereof.

Some examples of the method 1100 and the apparatus described herein may further include operations, features, circuitry, logic, means, or instructions for selecting a subset of memory cells from the set of memory cells for each read threshold of the at least three read thresholds, where a respective subset of memory cells corresponds to a respective read threshold and a respective counter, and incrementing the respective counter based on a quantity of the respective subset of memory cells that correspond to the first logic state.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

If used to describe a conditional action or process, the terms "if," "when," "based on," "based at least in part on," and "in response to," may be interchangeable.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." If used to describe a conditional action or process, the terms "if," "when," "based on," "based at least in part on," and "in response to," may be interchangeable.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   one or more memory devices; and
   a controller for the one or more memory devices, the controller configured to cause the apparatus to:
   read data from a set of memory cells within the one or more memory devices using at least three read thresholds, each memory cell of the set of memory cells configured to store a respective plurality of bits each corresponding to a respective level of a plurality of levels each corresponding to a respective subset of read thresholds of the at least three read thresholds;
   increment each counter of a set of counters based at least in part on reading the data, the set of counters comprising a first counter corresponding to a first level of the plurality of levels and a second counter corresponding to a second level of the plurality of levels;
   detect an error in the data based at least in part on reading the data using the at least three read thresholds;
   adjust one or more of the at least three read thresholds based at least in part on the set of counters; and
   read the data from the set of memory cells after adjusting the one or more of the at least three read thresholds.

2. The apparatus of claim 1, wherein, to increment each counter of the set of counters, the controller is configured to cause the apparatus to:
   increment the first counter corresponding to the first level, the first counter indicating a quantity of bits stored by the set of memory cells that correspond to a first logic value; and
   increment the second counter corresponding to the second level, the second counter indicating a quantity of outputs from one or more logic gates corresponding to a particular logic value.

3. The apparatus of claim 2, wherein inputs to the one or more logic gates comprise a first bit stored by a first memory cell and a second bit stored by the first memory cell, the first bit corresponding to the first level and the second bit corresponding to the second level.

4. The apparatus of claim 2, wherein, to increment each counter of the set of counters, the controller is configured to cause the apparatus to:
   increment a third counter corresponding to a third level of the plurality of levels, the third counter indicating a second quantity of outputs from the one or more logic gates corresponding to a particular logic value, wherein inputs to the one or more logic gates comprise a first bit stored by a first memory cell, a second bit stored by the first memory cell, and a third bit stored by the first memory cell; and
   wherein the first bit corresponds to the first level, the second bit correspond to the second level, and the third bit corresponds to the third level.

5. The apparatus of claim 1, wherein the controller is further configured to cause the apparatus to:
   determine a quantity of bits that correspond to a first logic value based at least in part on a combination of counts, each of the counts indicated by a respective counter of the set of counters.

6. The apparatus of claim 5, wherein the combination of counts comprises a linear combination of a first count indicated by the first counter, a second count indicated by the second counter, a third count indicated by a third counter, a fourth count indicated by a fourth counter, or any combination thereof.

7. The apparatus of claim 5, wherein a direction, a magnitude, or both of the adjusting of the at least three read thresholds is based at least in part on the quantity of bits that correspond to the first logic value.

8. The apparatus of claim 1, wherein, to adjust the one or more of the at least three read thresholds, the controller is configured to cause the apparatus to:
adjust the at least three read thresholds in a direction indicated by the set of counters.

9. The apparatus of claim 1, wherein, to adjust the one or more of the at least three read thresholds, the controller is configured to cause the apparatus to:
adjust the at least three read thresholds by a magnitude indicated by the set of counters.

10. The apparatus of claim 1, wherein the controller is further configured to cause the apparatus to:
select a direction of adjustment, a magnitude of adjustment, or both associated with the adjusting of the one or more of the at least three read thresholds based at least in part on the set of counters.

11. The apparatus of claim 1, wherein the controller is further configured to cause the apparatus to:
detect a second error in the data based at least in part on reading the data from the set of memory cells after adjusting the one or more of the at least three read thresholds; and
readjust the one or more of the at least three read thresholds based at least in part on detecting the second error.

12. The apparatus of claim 1, wherein the at least three read thresholds each comprise a respective voltage threshold, a respective current threshold, or any combination thereof.

13. An apparatus, comprising:
one or more memory devices; and
a controller for the one or more memory devices, the controller configured to cause the apparatus to:
read data from a set of memory cells within the one or more memory devices using at least three read thresholds, each memory cell of the set of memory cells configured to store at least two bits;
increment each counter of a set of counters based at least in part on reading the data using the at least three read thresholds, wherein each counter of the set of counters corresponds to a respective read threshold of the at least three read thresholds and indicates a respective quantity of bits of the data corresponding to a first logic value;
adjust a first quantity indicated by a first counter of the set of counters using a second quantity indicated by a second counter of the set of counters;
adjust, after adjusting the first quantity indicated by the first counter, one or more of the at least three read thresholds based at least in part on the set of counters; and
read the data from the set of memory cells after adjusting the one or more of the at least three read thresholds.

14. The apparatus of claim 13, wherein the controller is further configured to cause the apparatus to:
determine the first quantity indicated by the first counter, the first quantity indicating a quantity of bits for a first respective threshold of the at least three read thresholds that correspond to the first logic value; and
determine the second quantity indicated by the second counter, the second quantity indicating a quantity of bits for a second respective threshold of the at least three read thresholds that correspond to the first logic value.

15. The apparatus of claim 13, wherein, to adjust the first quantity, the controller is configured to cause the apparatus to:
subtract the second quantity from the first quantity.

16. The apparatus of claim 13, wherein the controller is further configured to cause the apparatus to:
adjust a third quantity indicated by a third counter of the set of counters based at least in part on the first quantity, the second quantity, or both.

17. The apparatus of claim 13, wherein the controller is further configured to cause the apparatus to:
adjust a first threshold of the at least three read thresholds in a direction indicated by the first counter, a second threshold of the at least three read thresholds in a direction indicated by the second counter, a third threshold of the at least three read thresholds in a direction indicated by a third counter, a fourth threshold of the at least three read thresholds in a direction indicated by a fourth counter, or any combination thereof.

18. The apparatus of claim 13, wherein the controller is further configured to cause the apparatus to:
adjust a first threshold of the at least three read thresholds by a magnitude indicated by the first counter, a second threshold of the at least three read thresholds by a magnitude indicated by the second counter, a third threshold of the at least three read thresholds by a magnitude indicated by a third counter, a fourth threshold of the at least three read thresholds by a magnitude indicated by a fourth counter, or any combination thereof.

19. The apparatus of claim 13, wherein the controller is further configured to cause the apparatus to:
select a subset of memory cells from the set of memory cells for each read threshold of the at least three read thresholds, wherein a respective subset of memory cells corresponds to a respective read threshold and a respective counter; and
increment the respective counter based at least in part on a quantity of the respective subset of memory cells that correspond to a first logic state.

20. A method performed by a memory system, the method comprising:
reading data from a set of memory cells within one or more memory devices using at least three read thresholds, each memory cell of the set of memory cells configured to store a respective plurality of bits each corresponding to a respective level of a plurality of levels each corresponding to a respective subset of read thresholds of the at least three read thresholds;
incrementing each counter of a set of counters of the one or more memory devices based at least in part on reading the data, the set of counters comprising a first counter corresponding to a first level of the plurality of levels and a second counter corresponding to a second level of the plurality of levels;
detecting an error in the data based at least in part on reading the data using the at least three read thresholds;

adjusting one or more of the at least three read thresholds based at least in part on the set of counters of the one or more memory devices; and reading the data from the set of memory cells after adjusting the one or more of the at least three read thresholds.

21. The method of claim 20, wherein incrementing each counter of the set of counters comprises:

incrementing the first counter corresponding to the first level, the first counter indicating a quantity of bits stored by the set of memory cells that correspond to a first logic value; and incrementing the second counter corresponding to the second level, the second counter indicating a quantity of outputs from one or more logic gates corresponding to a particular logic value.

22. The method of claim 21, wherein inputs to the one or more logic gates comprise a first bit stored by a first memory cell and a second bit stored by the first memory cell, the first bit corresponding to the first level and the second bit corresponding to the second level.

23. A method performed by a memory system, the method comprising:

reading data from a set of memory cells within one or more memory devices using at least three read thresholds, each memory cell of the set of memory cells configured to store at least two bits;

incrementing each counter of a set of counters of the one or more memory devices based at least in part on reading the data using the at least three read thresholds, wherein each counter of the set of counters corresponds to a respective read threshold of the at least three read thresholds and indicates a respective quantity of bits of the data corresponding to a first logic value;

adjusting a first quantity indicated by a first counter of the set of counters using a second quantity indicated by a second counter of the set of counters;

adjusting, after adjusting the first quantity indicated by the first counter, one or more of the at least three read thresholds based at least in part on the set of counters of the one or more memory devices; and reading the data from the set of memory cells after adjusting the one or more of the at least three read thresholds.

24. The method of claim 23, further comprising:

determining the first quantity indicated by the first counter, the first quantity indicating a quantity of bits for a first respective threshold of the at least three read thresholds that correspond to the first logic value; and determining the second quantity indicated by the second counter, the second quantity indicating a quantity of bits for a second respective threshold of the at least three read thresholds that correspond to the first logic value.

25. The method of claim 23, wherein adjusting the first quantity comprises:

subtracting the second quantity from the first quantity.

* * * * *